(12) United States Patent
Matsuda et al.

(10) Patent No.: US 6,331,672 B1
(45) Date of Patent: *Dec. 18, 2001

(54) PHOTOVOLTAIC CELL AND METHOD FOR MANUFACTURING THE SAME

(75) Inventors: Koichi Matsuda, Nara; Jinsho Matsuyama, Souraku-gun, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/807,590

(22) Filed: Feb. 27, 1997

(30) Foreign Application Priority Data

Mar. 1, 1996 (JP) .................................... 8-070961

(51) Int. Cl.$^7$ .................................... H01L 31/00
(52) U.S. Cl. .................... 136/256; 438/69; 438/71
(58) Field of Search .................. 136/259; 438/69, 438/71

(56) References Cited

U.S. PATENT DOCUMENTS

| | | | |
|---|---|---|---|
| 4,532,372 | 7/1985 | Nath et al. | 136/256 |
| 4,598,306 | 7/1986 | Nath et al. | 357/30 |
| 4,689,438 | * 8/1987 | Fukatsu et al. | 136/256 |
| 4,808,462 | * 2/1989 | Yaba et al. | 136/256 |
| 5,549,763 | * 8/1996 | Sano et al. | 136/255 |
| 5,620,530 | * 4/1997 | Nakayama | 136/259 |
| 5,807,440 | * 9/1998 | Kubota et al. | 136/256 |

FOREIGN PATENT DOCUMENTS

| | | | |
|---|---|---|---|
| 59-43101 | 10/1984 | (JP) | H01L/31/04 |
| 60-84888 | 5/1985 | (JP) | H01L/31/04 |
| 60-41878 | 9/1985 | (JP) | H01L/31/04 |

OTHER PUBLICATIONS

Applied Physics Letters, vol. 43, No. 7, Oct. 1, 1983, Y. Hamakawa et al., "New Types of High Efficiency Solar Cells based on a–Si" pp. 644–646.

IEEE Photovoltaic Specialists Conference, Sep. 27–30, 1982, pp. 1425–1426, H. Deckman et al., "Optical Enhancement of a–SiH, Solar Cells".

IEEE Photovoltaic Specialists Conference, Sep. 27–30, 1982, pp. 1423–1424, T. Tiedje et al., "Enhanced Optical Absorption Produced by Light Trapping in Amorphous Silicon Films".

\* cited by examiner

Primary Examiner—Mark Chapman
(74) Attorney, Agent, or Firm—Fitzpatrick, Cella, Harper & Scinto

(57) ABSTRACT

A photovoltaic cell comprising a substrate, a back reflector, a transparent conductive layer, and a photoelectric conversion layer, wherein the transparent conductive layer has holes on the surface, is provided. Additionally, a photovoltaic cell comprising a substrate, a back reflector, a transparent conductive layer, and a photoelectric conversion layer, wherein diffuse reflectance of the back reflector is 3 to 50%, is provided. According to the above-described structures, processability, yield and reliability of the photovoltaic cell can be improved, while photoelectric conversion efficiency is maintained at a high level due to back-surface diffuse reflection.

38 Claims, 9 Drawing Sheets

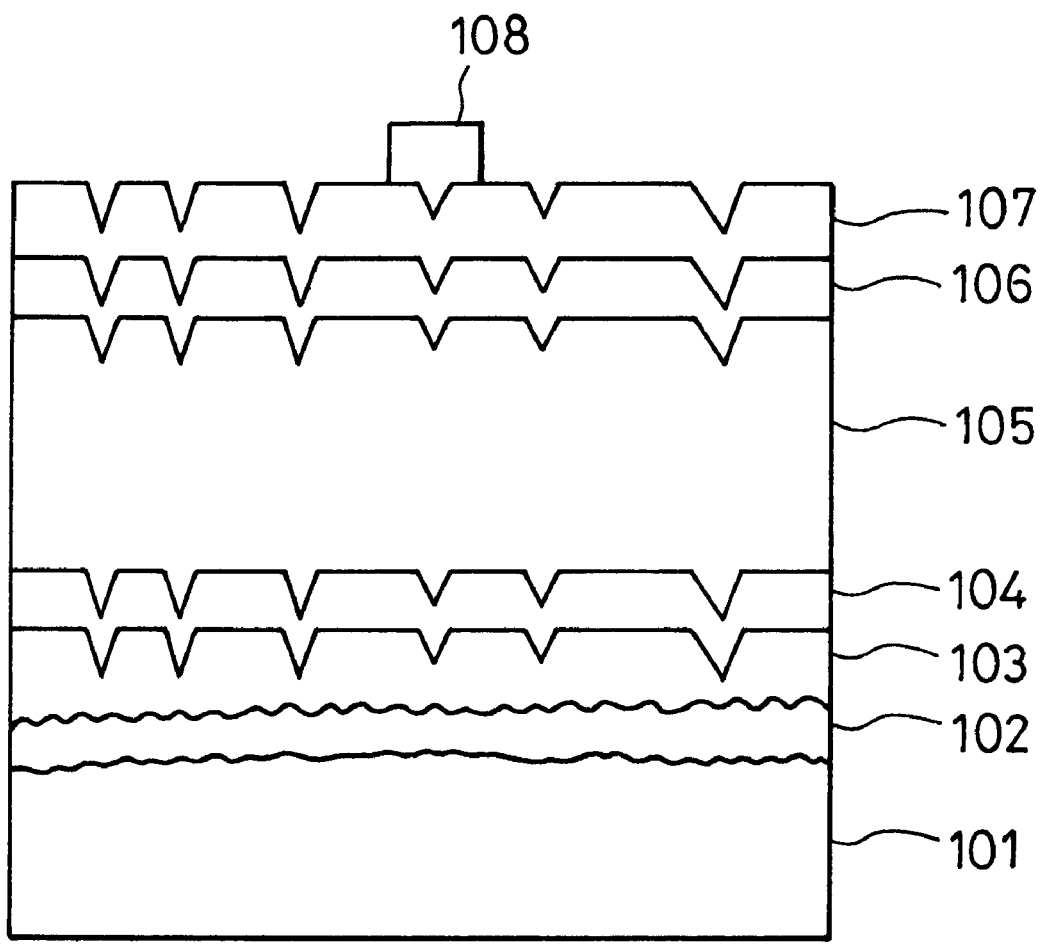

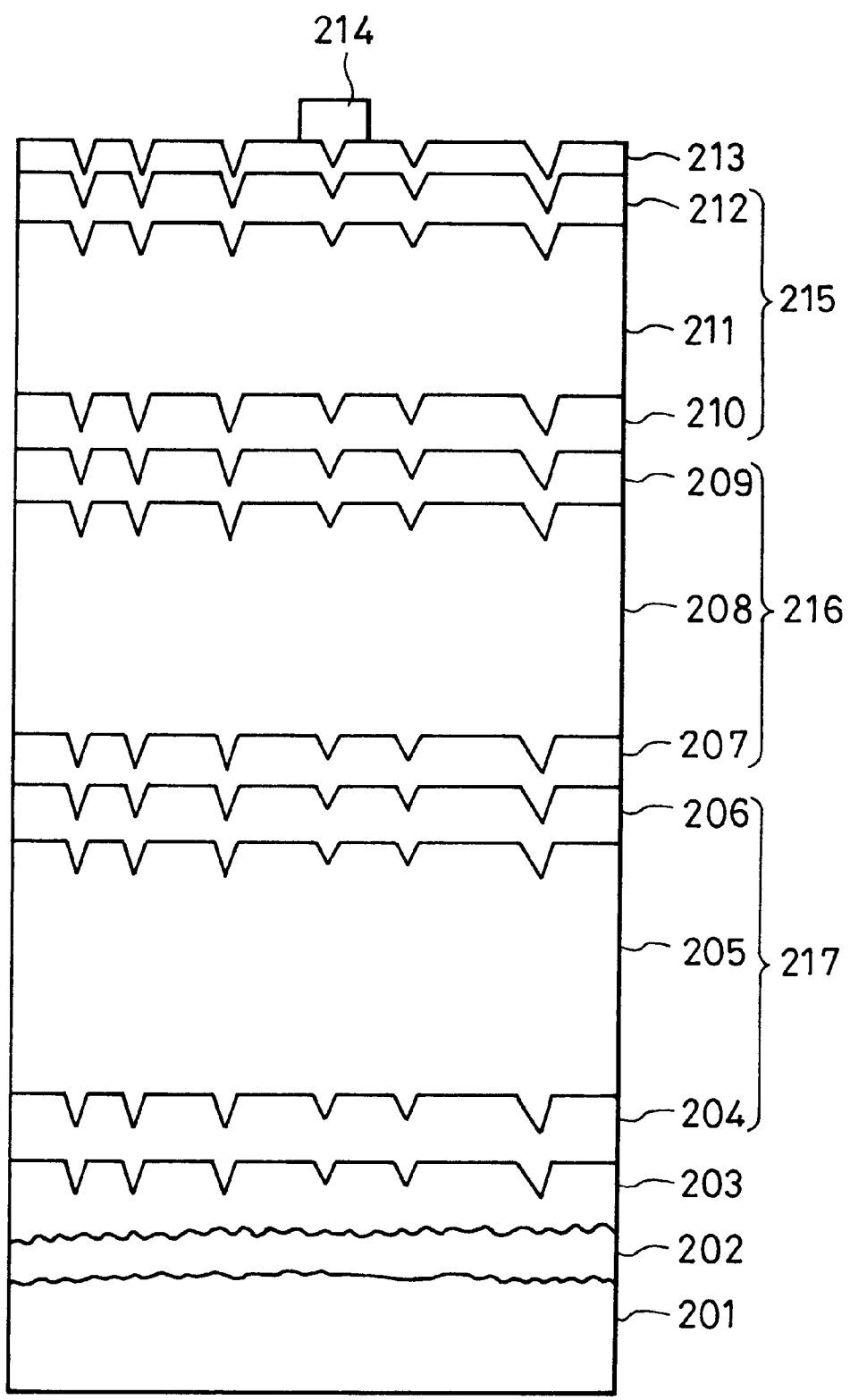

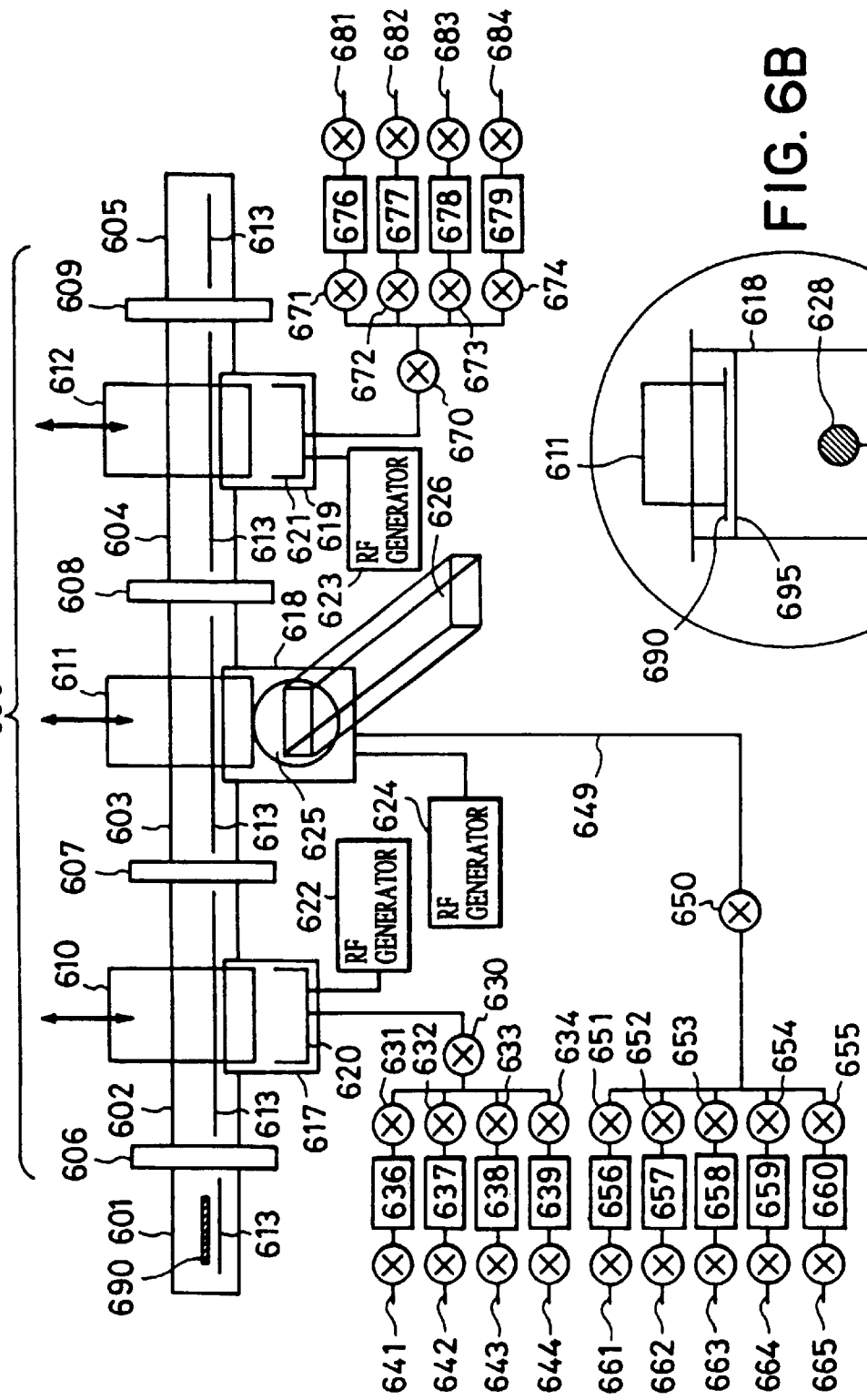

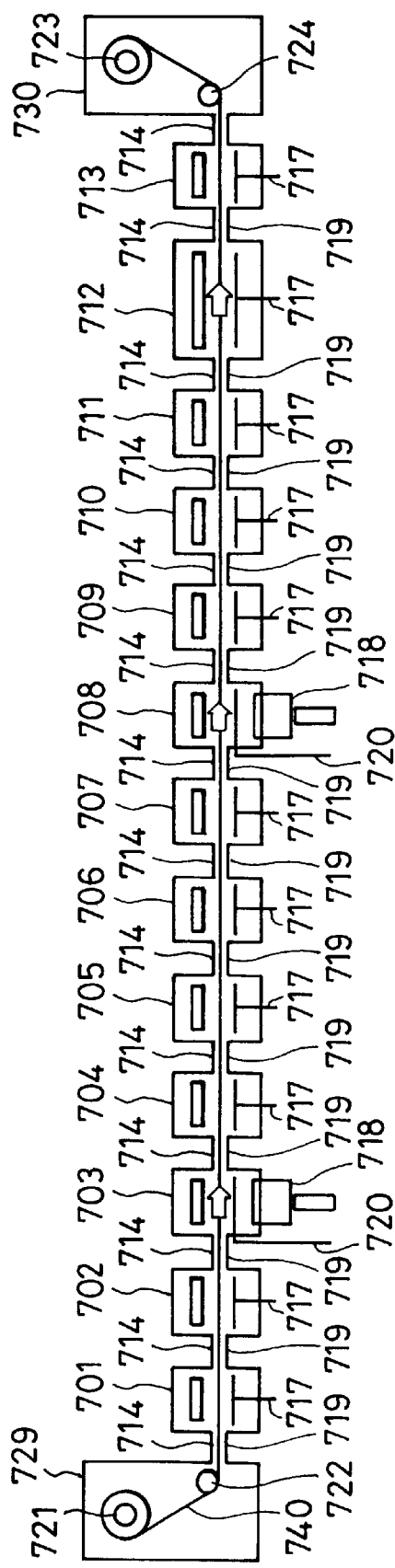
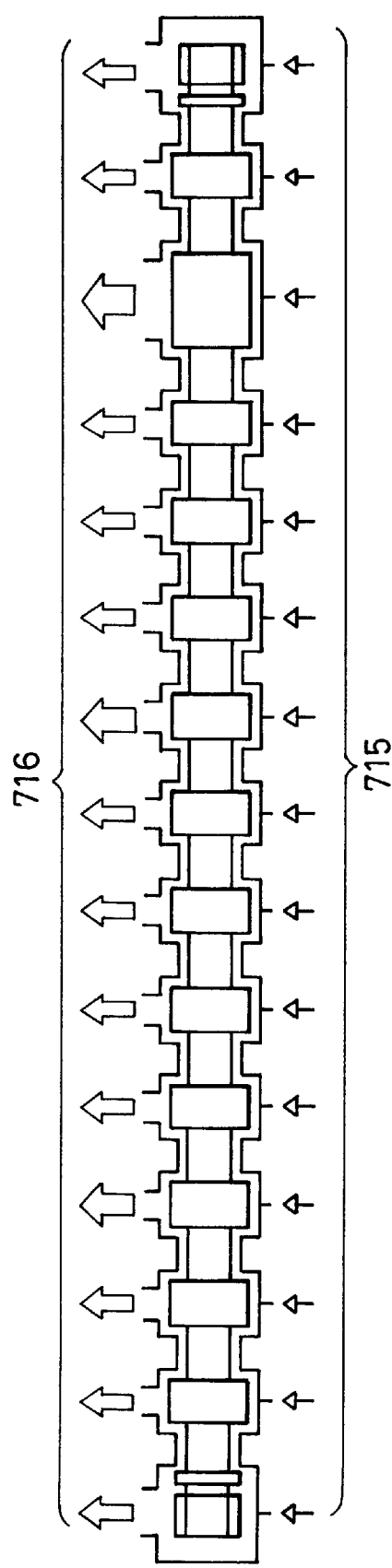
FIG. 7A
FIG. 7B

PHOTOVOLTAIC CELL AND METHOD FOR MANUFACTURING THE SAME

BACKGROUND OF THE INVENTION

1. Field of the Invention

The present invention relates to a photovoltaic cell having a rear-surface reflecting layer (hereinafter referred to as a back reflector).

2. Description of the Related Art

Hitherto, as a known method for improving the conversion efficiency of a photovoltaic cell, the photoelectric conversion layer of a photovoltaic cell is coated with a metallic reflection layer to efficiently utilize incident light, wherein the metallic reflection layer is provided on a surface of the conversion layer opposite the surface upon which light is incident (hereinafter referred to as light-entering surface). Further, in another known method, a transparent conductive layer is provided between such a metallic reflection layer and the photoelectric conversion layer. According to this structure, diffusion of ingredients in the metallic reflection layer into the photoelectric conversion layer can be prevented, flow of excess current can be prevented as well when electrical shorts occur in the photoelectric conversion layer, and further, adhesion of the photoelectric layer can be improved. Such methods are disclosed, for example, in Japanese Examined Patent Publications No. 5943101, No. 60-41878, and 60-84888. Additionally, Y. Hamanaka, et al., Appl. Phys. Lett., vol. 43, p. 644 (1983), have disclosed the insertion of a $TiO_2$ transparent conductive layer between a metallic layer and a photoelectric conversion layer.

Moreover, it is also proposed to make the front surface of such a transparent conductive layer finely lumpy, namely, to introduce a so-called textured structure onto the front surface. According to such a structure, light is scattered at the interface between the transparent conductive layer and the photoelectric conversion layer, and as a result, more efficient light-absorption can be achieved. Such a method is disclosed, for example, by H. Deckman Proc. 16th IEEE Photovoltaic Specialist Conf., p. 1425 (1982).

The above-mentioned structures, however, cause some problems concerning processability or durability when a photovoltaic cell is practically manufactured while employing a rear-surface electrode (hereinafter referred to as a back electrode) which has such a structure.

One of them is a problem concerning the so-called textured structure. Hitherto, the textured structure typically comprises a rough surface with pyramidal lumpy patterns as illustrated in Tiedje, et al., Proc. 16th IEEE Photovoltaic Specialist Conf., p. 1423 (1982), since such pyramidal lumpy patterns are considered to exhibit an excellent light-confinement effect. When a transparent conductive layer is formed on such a surface of a substrate, however, the surface of the transparent conductive layer will also be rough with pyramidal lumpy patterns. Due to this, when such a transparent conductive layer is inserted between a back reflector and a semiconductor layer (a component layer of a photoelectric conversion layer), current leakage in a photovoltaic cell through defective parts or the like in the semiconductor layer become large, and therefore, the yield of the photovoltaic cell is frequently reduced. Further, when a semiconductor layer of a photovoltaic cell is formed on a rough surface with pyramidal lumpy patterns, the substantial thickness of the semiconductor layer become thinner than that of a semiconductor layer formed on a specular surface. Accordingly, a doped layer or the like of the photovoltaic cell, which is originally designed to be thin, becomes further thinner, and in some cases, the photovoltaic cell has a lower open circuit voltage (Voc) and a fill factor (FF) as compared to a photovoltaic cell formed on specular surfaces of substrates.

Moreover, a photovoltaic cell which has a metallic back reflector comprising Ag, Cu or the like has been found to undergo migration of Ag, Cu or the like when it is used in a humid atmosphere with a plus bias voltage upon the metallic back reflector, where such migration generates continuity to the electrode on the light-entering side to cause shunting in the photovoltaic cell. This phenomenon is remarkable when the metallic back reflector has a textured structure, namely, a surface which is rough to the same level as the wavelength of light in the layer.

Additionally, in a case where Al is used for the metallic back reflector, although migration occurring in the case where Ag or Cu is used does not occur, the reflectance may be reduced when a textured structure is employed. Especially, in some case where a transparent conductive layer is stacked on an Al layer having a textured structure, the reflectance is severely reduced.

Meanwhile, in practice, substrates having surfaces with the least possible roughness as being nearly specular have been preferred for photovoltaic cells in view of their characteristics and yields. However, when a back reflector or both a substrate and a back reflector of a photovoltaic cell are formed so as to have diffuse reflectance values of 1% or less, the surface of a transparent conductive layer to be formed also becomes smooth. In this case, since light is less scattered on the rear surface of the photovoltaic cell, light-absorption by a semiconductor layer of the photovoltaic cell is insufficient. At the same time, in some combinations of materials for the substrate and the back electrode, adhesion between the substrate and the back reflector, the back reflector And the transparent conductive layer, or the transparent conductive layer and the semiconductor layer is also insufficient, and therefore, peeling readily occurs at any interface between these layers during the manufacturing process of the photovoltaic cell. Additionally, polishing a surface of the substrate so as to be specular requires an increased cost in producing the substrate, and therefore, the cost of manufacturing photovoltaic cells also increases.

The above-described problems markedly occur when a practicably-suitable and low-cost manufacturing process is employed, for example, a low-cost substrate comprising a resin film or stainless steel is used, or the manufacturing rate is hastened by hastening the rate of manufacturing semiconductor layers. The manufacturing yields of photovoltaic cells have been limited to low levels due to such problems.

SUMMARY OF THE INVENTION

Accordingly, an object of the present invention is to provide a thin-film photovoltaic cell having high reliability and high photoelectric conversion efficiency while introducing a novel structure to the substrate including a transparent conductive layer in order to solve the above-described problems concerning processability, yield, and durability, thus achieving increased light-absorption by the semiconductor layer, practicably suitable and low-cost manufacture, and high-yield production.

More specifically, an aspect of the present invention is a photovoltaic cell having a substrate, a back reflector, a transparent conductive layer, and a photoelectric conversion layer, wherein the transparent conductive layer has holes on its surface.

According to this structure, problems inherent in the conventional textured structures can be solved.

Additionally, in a photovoltaic cell having a substrate, a back reflector, a transparent conductive layer, and a photoelectric conversion layer, the diffuse reflectance of the back reflector may be specified as 3% to 50% according to the present invention. According to this specification, adhesion of the back reflector and conversion efficiency of the photoelectric conversion layer can be improved, and further, the aforementioned transparent conductive layer having holes can be readily formed.

According to the present invention, adhesion between the back reflector and the transparent conductive layer can be improved due to properly introduced surface roughness. Further, in contrast to the cases where the textured structure comprises pyramidal lumpy patterns, since contact area between the back reflector and the transparent conductive layer is not too large, diffusion or migration of the metal of the back reflector can be restricted, and reaction between the metal of the back reflector and the ingredient of the transparent conductive layer, which can reduce the reflectance, can be inhibited. These effects are remarkable when aluminum is used as a suitable material for the back reflector. Moreover, since light reaching the back reflector is diffuse-reflected, the optical pathlength can be extended, and therefore, incident light can be efficiently utilized.

As a result, series resistance is decreased; current leakage is reduced; short-circuit current, open circuit voltage, and fill factor are improved; and therefore, high conversion efficiency can be achieved. Additionally, high yield can be secured while flexibility and controllability of the process for manufacturing the photovoltaic cell can be improved. Further, the photovoltaic cell of the present invention has been found to exhibit improved weatherability according to the results of a cyclic high-temperature high-humidity test, a salt water immersion test and others.

Furthermore, the photovoltaic cell of the present invention has been found to exhibit enhanced durability according to the results of mechanical strength tests such as a scratch test, a bending test and others.

Further, in the photovoltaic cell of the present invention, the back reflector having suitable diffuse reflectance can be readily formed by using stainless steel for the substrate.

Moreover, light-scattering at the interface between the photoelectric conversion layer and a transparent electrode thereabove is enhanced by forming holes on the surface of the photovoltaic cell. According to such a configuration, light is scattered at the light-entering side and the opposite side of the photoelectric conversion layer, namely, optical pathlength in the photoelectric conversion layer is further extended, and therefore, light-absorption and short-circuit current can be increased.

In addition, when zinc oxide is used for the transparent conductive layer, the transparent conductive layer has a proper resistance to reduce the current flow through defective parts of the photoelectric conversion layer. As a result, less shunting occurs in the photovoltaic cell of the present invention, and yield of the photovoltaic cell can be improved. Furthermore, due to C-axis oriented crystalline structure of zinc oxide, conical or pyramidal holes can be readily formed on the surface of the transparent conductive layer.

BRIEF DESCRIPTION OF THE DRAWINGS

FIG. 1 shows an example of a layered structure of a photovoltaic cell according to the present invention;

FIG. 2 shows an example of a layered structure of a photovoltaic cell according to the present invention;

FIG. 6 schematically shows a deposition apparatus suitable to manufacture a photovoltaic cell according to the present invention;

FIG. 7 contains 2 drawings, FIG. 7A which schematically shows a roll-to-roll depositing system suitable to manufacture a photovoltaic cell according to the present invention, and FIG. 7B which is a perspective top plan view schematically showing the roll-to-roll depositing system suitable to manufacture a photovoltaic cell according to the present invention;

DESCRIPTION OF THE PREFERRED EMBODIMENT

Figure 3C:
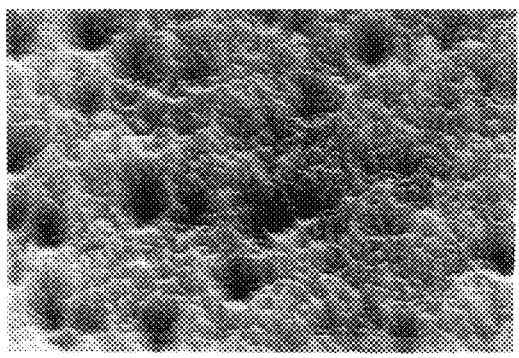
FIG. 3 contains 4 drawings, FIGS. 3A, 3B, 3C, and 3D, which are electron micrographs of the thin-film transparent conductive layer in the substrate of a photovoltaic cell according to the present invention.
Figure 3A:
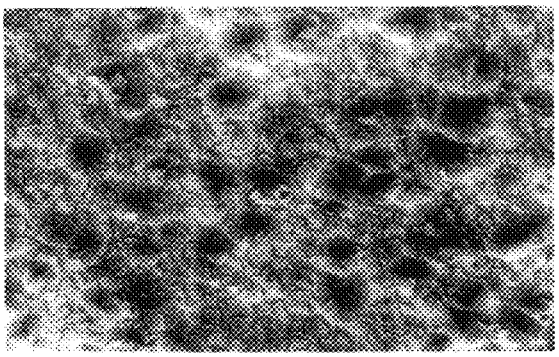
Figure 3D:
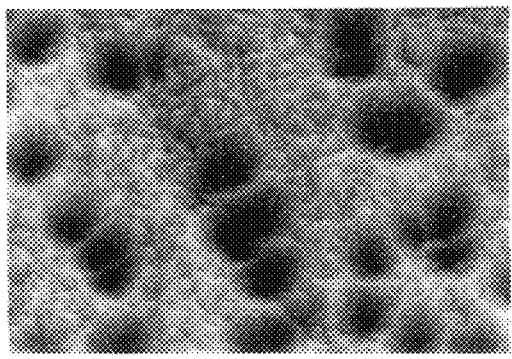
Figure 3B:
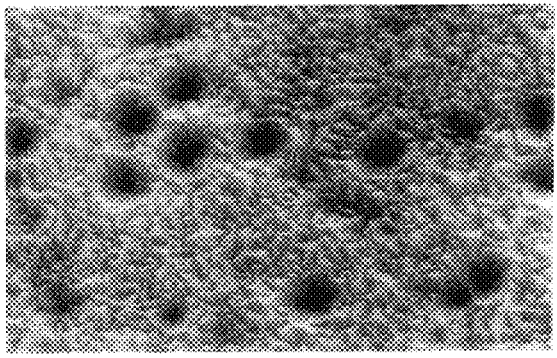

The structure of the photovoltaic cell according to the present invention and the method for manufacturing the same will be illustrated in detail below with reference to the drawings.

FIG. 1 is a schematic sectional view of one example photovoltaic cell for illustrating the concept of the present invention in detail. As a matter of course, the scope of the present invention is not limited to such a photovoltaic cell having a structure shown in FIG. 1. In FIG. 1, 101 indicates a substrate; 102 indicates a metallic back reflector; 103 indicates a transparent conductive layer; 104 indicates a n-type semiconductor layer; 105 indicates an i-type semiconductor layer; 106 indicates a p-type semiconductor layer;

107 indicates a transparent electrode; and 108 indicates a collecting electrode. Incidentally, in the structure shown in FIG. 1, incident light enters from the p-type semiconductor side. When the photovoltaic cell has a structure in which incident light enters from the n-type semiconductor layer side, layer 104 should be the p-type semiconductor layer while layer 106 should be the n-type semiconductor layer.

Additionally, an adhesive layer may be inserted between the substrate 101 and the metallic back reflector 102 in order to enhance adhesion of the metallic back reflector to the substrate.

FIG. 2 is a schematic sectional view of one example of a stacked-type photovoltaic cell for illustrating the concept of the present invention in detail. The stacked-type photovoltaic cell of the present invention shown in FIG. 2 has a structure in which the components are stacked with three pin junctions. From the light-entering side, 215 indicates the first pin junction; 216 indicates the second pin junction, and 217 indicates the third pin junction. These three pin junctions are stacked on a substrate laminate which comprises a substrate 201, and a metallic back reflector 202 and a transparent conductive layer 203 formed on the substrate. Further, a transparent electrode 213 and a collecting electrode 214 are formed at the top of the pin junctions to form a stacked-type photovoltaic cell. Each of the three pin junctions comprises an n-type semiconductor layer 204, 207, or 210; an i-type semiconductor layer 205, 208, or 211; and a p-type semiconductor layer 206, 209, or 212, respectively. Incidentally, similar to the photovoltaic cell shown in FIG. 1, the positions of the doped layers or electrodes may be altered depending on the direction of incident light.

Each layer of the photovoltaic cell according to the present invention is further illustrated below in the order of formation.

<Substrate>

A substrate suitable for the present invention should satisfy the following scope of requirements: It can restrict current leakage in the photovoltaic cell; a high manufacture yield of the photovoltaic cell can be maintained by use of it; and it has a surface configuration suitable for enhancing adhesion to the back reflector. Specifically, the substrate does not have a specular surface nor a rough surface with pyramidal lumpy patterns, but has a suitably rough surface with a diffuse reflectance of 3% to 50%. According to such a surface configuration of the substrate, current leakage in the photovoltaic cell can be restricted, adhesion to the back reflector can be enhanced, yield of the photovoltaic cell can be improved, and weatherability and durability of the manufactured photovoltaic cell can be improved. Incidentally, substrates having diffuse reflectance values out of the above-described range can also be used when the back reflector is suitably thick to satisfy the desired diffuse reflectance in combination.

Further, the material for a substrate may or may not be single crystalline and may be conductive or electrically insulating. Additionally, although the material may or may not be light-transmissive, it should preferably be less deformed and distorted and have a desired strength. Examples of such materials include thin sheets of metals such as Fe, Ni, Cr, Al, Mo, Au, Nb, Ta, V, Ti, Pt, and Pb; thin sheets of alloys comprising the above-listed metals such as brass or stainless steel; complex sheets of the above-mentioned metals and/or alloys; films or sheets of thermostable synthetic resins such as polyester, polyethylene, polycarbonate, cellulose acetate, polypropylene, polyvinyl chloride, polyvinylidene chloride, polystyrene, polyamide, polyimide, and epoxy; complex materials of these resins with glass fiber, carbon fiber, boron fiber, or metal fiber; coated materials comprising above-mentioned thin steel sheets or resin sheets, each of which is coated with a dissimilar metal thin film and/or insulating thin film such as $SiO_2$, $Si_3N_4$, $Al_2O_3$, and AlN by sputtering, vapor deposition, plating, or the like; glass materials; and ceramic materials. Among the above-described materials, stainless steel is especially satisfactory in view of processability and durability.

When the substrate comprises a metallic material or the like and is conductive, the substrate can also serve as an electrode for current output. On the other hand, when the substrate comprises a resin material or the like anri is electrically insulating, the surface of the substrate facing the side for layer component deposition should preferably be coated with a conductive material by plating, vapor deposition, sputtering, or the like in order to form an electrode for current output. Examples of such conductive materials include simple metals, alloys or transparent conductive oxides (TCO) such as Al, Ag, Pt, Au, Ni, Ti, Mo, W, Fe, V, Cr, Cu, stainless steel, brass, nichrome, $SnO_2$, $In_2O_3$, ZnO, and ITO.

As a matter of course, even if the substrate comprises a metallic material or the like and is conductive, a dissimilar metal layer or the like may be provided on the surface of the substrate facing the side for layer component deposition in order to improve reflectance of long wavelength light at the substrate surface or to prevent mutual diffusion of ingredient elements between the substrate material and layer components.

The substrate material may have the shape of a sheet, a long belt, a cylinder, or the like. The thickness of the substrate may optionally be determined so as to obtain a desired photovoltaic cell. When the photovoltaic cell needs to be highly flexible, or when light incidence is performed from the side of the substrate, the substrate can be as thin as possible within a range for sufficiently exhibiting functions as a substrate. Ordinarily, the thickness is set at 10 $\mu$m or more in view of productivity, manageability, mechanical strength, and the like.

<Back Reflector>

The metallic back reflector 102 or 202 to be used in the present invention is disposed on a surface of a semiconductor layer, the surface facing away from incident light, and serves as a light-reflecting layer which reflects light unabsorbed by the semiconductor layer back into the semiconductor layer. Additionally, it also serves as a back electrode of a photovoltaic cell.

The surface roughness of the metallic back reflector is one feature of the present invention. The back reflector does not have a specular surface nor a rough surface with pyramidal lumpy patterns, but has a rough surface satisfying a diffuse reflectance of preferably 3% to 50%, and more preferably 10% to 45%. Due to such a metallic back reflector, adhesion between the metallic back reflector and a transparent conductive layer can be enhanced, flexibility and controllability of the process for manufacturing the photovoltaic cell can be improved, and further, since diffusion of metal in the metallic back reflector can be restricted, current leakage in the photovoltaic cell can be reduced, the manufacturing yield of the photovoltaic cell can be improved, and weatherability and durability of the photovoltaic cell can be improved. Additionally, neater orientation of polycrystals in the transparent conductive layer can be achieved, the average grain diameter of the polycrystals in the transparent conductive layer can be increased while dispersion in grain diameters can be reduced, and conical holes or pyramidal holes can be easily formed on the surface of the transparent conductive layer. As a result, light-scattering on the surfaces of the metallic back reflector and the transparent conductive layer can be enhanced, and short-circuit current (Jsc) can be increased.

When the thickness of the metallic back reflector is set as thin as, for example, 0.1 μm or less, the metallic back reflector will have a surface configuration inherited from that of the substrate. On the other hand, when the thickness of the metallic back reflector is set as thick as, for example, 1 μm or more, the surface will be relatively even.

Examples of materials for the back reflector include metals such as Au, Ag, Cu, Al, Mg, Ni, Fe, Cr, Mo, W, Ti, Co, Ta, Nb, and Zr; and alloys such as stainless steel. Among them, preferably used are highly reflective metals such as Al, Mg, Cu, Ag, and Au, or alloys each of which comprises a principal highly reflective metal as described above, and an additional dissimilar metal or silicon. By using a highly reflective metal material, light unabsorbed by a semiconductor layer can be highly reflected back into the semiconductor layer, the optical pathlength in the semiconductor layer can be extended, light-absorption by the semiconductor layer can be increased, and short-circuit current (Jsc) can be increased.

As the occasion demands, the back reflector may comprise two or more layers using two or more materials.

As a deposition method for forming the back reflector, several methods can be employed, for example, vapor deposition methods such as EB vapor deposition or sputtering vapor deposition; several CVD methods; several plating methods; and several printing methods.

Further, several methods can be employed as a method for obtaining a surface of the metallic back reflector which satisfies the wave-specified diffuse reflectance range while considering the material and the deposition method for the metallic back reflector. For example, such a surface can be achieved by properly heating the substrate during deposition. Alternatively, such a surface may be achieved by polishing or etching after deposition. As another way for achieving the desired function, the substrate may be formed so as to have a suitable diffuse reflectance, and the metallic back reflector is formed thereon.

<Transparent Conductive Layer>

A transparent conductive layer 103 is disposed between a metallic back reflector 102 and a semiconductor layer 104. Due to this transparent conductive layer, the following principal purposes should be achieved: At first, irregular reflection at the rear surface of the photovoltaic cell is enhanced, light is confined within the photovoltaic cell according to thin-film multiple-interference, the optical pathlength in the semiconductor layer is thereby extended, and short-circuit current (Jsc) in the photovoltaic cell is increased; secondly, diffusion or migration of metal of the iometallic back reflector into the semiconductor layer is prevented, and as a result, shunt in the photovoltaic cell can be prevented; and additionally, short circuit between the metallic back reflector 102 and a transparent electrode 107 through the semiconductor layer, which may be caused due to defects such as pin holes in the semiconductor layer, is prevented by making the transparent conductive layer slightly electrically resistant.

The surface configuration of the transparent conductive layer 103 is one feature of the present invention, and holes are dispersively formed on the surface of the transparent conductive layer. The holes should preferably be cone shaped or pyramid shaped. According to such a surface configuration of the transparent conductive layer, light is efficiently confined within the photovoltaic cell, and open circuit voltage (Voc) and fill factor (FF) can be improved while maintaining high short-circuit current (Jsc) even if the surface area of the transparent conductive layer is smaller than that of a transparent conductive layer which has a conventional rough surface with pyramidal lumpy patterns. Further, adhesion between the transparent conductive layer and the semiconductor layer can be enhanced, shunting in the photovoltaic cell can be prevented, manufacturing yield can be improved, and weatherability and durability can be improved.

As to the dimensions of such conical or pyramidal holes, coefficients C1 and C2 are defined as follows.

$$C1 = h/d$$

$$C2 = \rho \times d^2$$

In the above formulae, d is the average diameter of conical or pyramidal holes; h is the average depth of the holes; and ρ is the average density of the holes. The average diameter d should be preferably 0.05 to 2 μm, more preferably 0.1 to 1.5 μm, and most preferably 0.2 to 1 μm. The coefficient C1 should be preferably be 0.2 to 0.9, and more preferably 0.3 to 0.6. The coefficient C2 should be preferably be 0.02 to 1.0, and more preferably 0.1 to 0.8.

By optimizing the average diameter d of conical or pyramidal holes and the coefficients C1 and C2 within the above-described ranges, effects according to the present invention can be further enhanced.

Additionally, the transparent conductive layer 103 is required to have high transmittance of light within a wavelength range absorbable by the semiconductor layer, and have proper resistivity. Preferably, transmittance for light of wavelength 650 nm or longer is 80% or above, more preferably 85% or above, and most preferably 90% or above. Meanwhile, resistivity should preferably be $1 \times 10^{-4}$ to $1 \times 10^6$ Ω·cm, and more preferably $1 \times 10^{-2}$ to $5 \times 10^4$ Ω·cm.

As a material for the transparent conductive layer 103, conductive oxide-compounds or mixtures thereof are preferably used. Examples of such materials include $In_2O_3$, $SnO_2$, ITO ($In_2O_3 + SnO_2$), ZnO, CdO, $Cd_2SnO_4$, $TiO_2$, $Ta_2O_5$, $Bi_2O_3$, $MoO_3$, and $Na_xWO_3$. Additionally, such materials may further be admixed with an element for arranging resistivity (hereinafter referred to as dopant). Among the above-listed materials, ZnO is especially preferred since ZnO has a suitable resistance value, conical or pyramidal holes can be readily formed on the surface of a layer comprising ZnO due to its C-axis oriented crystalline structure, and ZnO is highly durable against plasma for forming the semiconductor layer.

As a dopant, for example, Al, In, B, Ga, Si, F or the like is preferably used when the transparent conductive layer 103 comprises ZnO; Sn, F, Te, Ti, Sb, Pb or the like is preferably used when it comprises $In_2O_3$; and F, Sb, P, As, In, Tl, Te, W, Cl, Br, I or the like is preferably used when it comprises $SnO_2$.

As a method for forming the transparent conductive layer 103, preferably employed are several vapor deposition methods such as EB vapor deposition or sputtering vapor deposition; several CVD methods; several spray methods; several spin-on methods; and several dipping methods.

<Method for Forming Holes on Surface of Transparent Conductive Layer>

Several methods can be employed for forming conical or pyramidal holes on the surface of a transparent conductive layer 103. For example, they may be formed by controlling crystal growth of polycrystals when the transparent conductive layer comprises polycrystals. Alternatively, they may be formed by vapor or liquid phase etching after the transparent conductive layer is formed.

Principal factors in relation to controlling crystal growth of polycrystals are the surface configuration of the metallic back reflector on which the transparent conductive layer is formed, and deposition conditions for the transparent conductive layer.

The surface configuration of the back reflector greatly affects the initial stage of crystal growth. When the back reflector surface is too rough, crystal nucleation density is too high, and initial grain diameters during crystal growth are too small. In contrast, when the back reflector surface is specular, peeling can occur between the back reflector and the transparent conductive layer. Based on these, the following specification has been conceived: The back reflector should have a surface configuration in which the diffuse reflectance of its surface at 800 nm wavelength is 3% to 50%. Due to such a surface configuration, proper crystal nucleation density can be achieved, and crystal growth progresses in a crystal orientation suitable for forming conical or pyramidal holes.

Meanwhile, as to conditions for depositing the transparent conductive layer, suitable ranges differ depending on the type of transparent conductive layer or deposition method, and the type or flow rate of gas, internal pressure, charged electrical power, deposition rate, temperature of the substrate, or the like greatly affect crystal growth. For example, when the transparent conductive layer is formed of ZnO by DC magnetron sputtering, the gas to be used may be Ar, Ne, Kr, Xe, Hg, $O_2$ or the like, and the flow rate, which should be altered depending on the scale of the deposition system and the exhaust rate, should preferably be 10 to 100 sccm in such a case where the space volume for deposition is 20 liters. Further, the internal pressure for deposition should preferably be $1 \times 10^{-4}$ to 0.1 Torr. The charged electrical power should preferably be a DC power of $-350$ to $-450$ V or a RF power of 100 to 1000 W when the target diameter is 15 cm, though the preferable range is altered depending on the material to be deposited. Moreover, the temperature of the substrate should preferably be 70 to 450° C., more preferably 100 to 350° C., and most preferably 150 to 250° C. when deposition is performed using ZnO at a deposition rate of 1 $\mu$m/h, though the preferable range is altered depending on the deposition rate.

As described above, when a suitable surface configuration of the metallic back reflector is employed while suitable conditions for depositing the transparent conductive layer are employed as well, polycrystals having small diameters are formed near the interface between the transparent conductive layer and the metallic back reflector, polycrystals having larger diameters are formed thereon in a columnar crystal orientation, and conical or pyramidal holes are formed on the surface of the transparent conductive layer.

As mentioned above, conical or pyramidal holes can also be formed by vapor or liquid phase etching after the transparent conductive layer is completed.

More specifically, as a vapor phase etching method, gas etching, plasma etching, ion etching, or the like can be employed. Examples of etching gases include $CF_4$, $C_2F_6$, $C_3F_8$, $C_4F_{10}$, $CHF_3$, $CH_2F_2$, $Cl_2$, $ClF_3$, $CCl_4$, $CCl_2F_2$, $CClF_3$, $CHClF_2$, $C_2Cl_2F_4$, $BCl_3$, $PCl_3$, $CBrF_3$, $SF_6$, $SiF_4$, $SiCl_4$, HF, $O_2$, $N_2$, $H_2$, He, Ne, Ar, Xe, or the like, and gaseous mixtures thereof. In plasma etching, the gas pressure should preferably be $10^{-3}$ to 1 Torr, and the energy source for generating plasma may be DC, AC, an RF wave of 1 to 100 MHz, or a microwave of 0.1 to 10 GHz.

As to liquid phase etching, examples of acids include sulfuric acid, hydrochloric acid, nitric acid, carbonic acid, phosphoric acid, hydrofluoric acid, chromic acid, sulfamic acid, oxalic acid, tartaric acid, citric acid, formic acid, lactic acid, glycollic acid, acetic acid, gluconic acid, succinic acid, and malic acid; aqueous solutions thereof; and mixture solutions thereof. Further, examples of alkalis include sodium hydroxide, ammonium hydroxide, potassium hydroxide, sodium carbonate, sodium hydrogencarbonate, sodium sesquicarbonate, sodium dihydrogenphosphate, disodium hydrogenphosphate, sodium phosphate, sodium pyrophosphate, sodium triphosphate, sodium tetraphosphate, sodium trimetaphosphate, sodium tetrametaphosphate, sodium hexametaphosphate, sodium orthosilicate, and sodium metasilicate; aqueous solutions thereof; and mixture solutions thereof. Additionally, the etching solution may be heated, or energy such as ultrasonic waves may be applied to the etching system.

Further, an annealing treatment may be performed after etching. Such an annealing treatment is performed in an atmosphere of gas such as air, water vapor, nitrogen, hydrogen, oxygen, an inert gas, or the like, and at a temperature for a treating time suitable for the material of the transparent conductive layer.

<Photoelectric conversion layer>

As a photoelectric conversion layer, silicon-type materials or compound-type materials are used, and they may be single crystals, polycrystals, microcrystals, or amorphous substances.

In the present invention, amorphous or microcrystalline Si, C, Ge or alloys thereof are especially preferably used. In addition, hydrogen and/or halogen atoms are contained in such an amorphous or microcrystalline substance at a preferable content of 0.1 to 40 atomic %. Further, oxygen, nitrogen or the like may be contained. The concentration of these impurities should preferably be $5 \times 10^{19}$ $cm^{-3}$ or less. Moreover, in order to obtain a p-type semiconductor, an element belonging to Group III of the periodic table should be contained, while a Group V element should be contained to obtain an n-type semiconductor.

Preferably, for a stacked-type photovoltaic cell, the i-type semiconductor layer in a pin junction closer to the light-entering side should have a wider band gap, and that more distant from the light-entering side should have a narrower band gap. Additionally, in each i-type semiconductor layer, the minimal value of the band gap should preferably appear in a position nearer to the p-type semiconductor layer than the thicknesswise center of the i-type semiconductor layer.

For a doped layer to be disposed on the light-entering side, a crystalline semiconductor having a low light-absorptivity or a semiconductor having a wide band gap is suitable.

Additionally, the surface of the photoelectric conversion layer may be provided with holes corresponding to the surface configuration of the transparent conductive layer.

<Method for Forming Semiconductor Layers for the Photoelectric conversion layer>

Microwave plasma CVD (MW-CVD) or radio frequency plasma CVD (RF-CVD) is suitable to form the above-described semiconductor layers. Each semiconductor layer is formed according to the following procedure.

1) A deposition chamber which can be evacuated to vacuum (vacuum chamber) is depressurized to a predetermined initial pressure.

2) A gas composition comprising material gas, diluting gas, and others is introduced to the deposition chamber, and the pressure inside the chamber is adjusted to a predetermined deposition pressure while evacuating the chamber with a vacuum pump.

3) The substrate is heated to a predetermined temperature.

4) In MW-CVD, microwaves from a microwave generator are introduced by a wave guide into the deposition chamber through a dielectric window comprising alumina ceramics or the like. When the microwave frequency is as low as 100 MHz to 1 GRz, they may be impressed on a metallic electrode.

In RF-CVD, radio waves from a radio frequency generator are introduced into the deposition chamber through a discharge electrode.

5) Plasma is generated from the material gas, and deposition film is formed on the substrate disposed in the deposition chamber.

When MW-CVD is employed, preferably, the temperature of the substrate in the deposition chamber is 100 to 450° C., the pressure inside the chamber is 0.5 to 30 mTorr, microwave power is 0.01 to 1 W/cm$^3$, microwave frequency is 0.1 to 10 GHz, and deposition rate is 0.05 to 20 nm/sec.

When RF-CVD is employed, preferably, RF frequency is 0.1 to 100 MHz, the temperature of the substrate in the deposition chamber is 100 to 350° C., the pressure inside the chamber is 0.1 to 10 Torr, RF power is 0.001 to .0.5 W/cm$^3$, and deposition rate is 0.01 to 3 nm/sec.

Material gas suitable for depositing a Group IV or Group IV-alloy amorphous semiconductor layer, which is preferred for the photovoltaic cell of the present invention, principally comprises a compound which can be gasified and contains silicon in the form of $SiH_4$, $Si_2H_6$ or the like; or a compound which can be gasified and contains germanium in the form of $GeH_4$ or the like.

Additionally, a compound which can be gasified and contains carbon, nitrogen, oxygen or the like can be used together with the material gas.

As a dopant gas for obtaining a p-type semiconductor layer, $B_2H_6$, $BF_3$, or the like is used.

As a dopant gas for obtaining an n-type semiconductor layer, $PH_3$, $PF_3$, or the like is used.

In particular, when a microcrystalline or poly-crystalline semiconductor layer which has low light-absorptivity is deposited, or when a semiconductor layer such as one comprising SiC or the like which has a wide band gap is deposited, the material gas should preferably be highly diluted with hydrogen gas, and relatively high microwave or RF power should preferably be applied.

<Transparent Electrode>

A transparent electrode can serve as an anti-reflection film when the electrode is of proper thickness.

A transparent electrode is formed from a material such as ITO, ZnO, or $In_2O_3$ by vapor deposition, CVD, spraying, spin-on, dipping, or the like. The material may contain a substance which has a conductivity-changing effect.

<Collecting Electrode>

A collecting electrode is provided in order to improve current collecting efficiency. This electrode can be provided, for example, by mask-sputtering to form a metallic electrode pattern, by printing using a conductive paste or a solder paste, or by fixing metallic wire with a conductive paste.

<Others>

As the occasion demands, protective layers may be provided on both surfaces of the photovoltaic cell. In addition, a reinforcing material such as a steel sheet may be used together with such protective layers.

EXAMPLES

The photovoltaic cell of the present invention will be illustrated in detail below by showing example photovoltaic cells and photodiodes which are manufactured using non-single crystal silicon semiconductor materials. As a matter of course, the following examples do not limit the scope of the present invention.

Example 1

Optimum Diffuse Reflectance

Pin-type photovoltaic cells having a structure shown in FIG. 1 were manufactured according to the specifications described in Table 1 using a substrate laminate which comprised a back reflector and a transparent conductive layer formed on a substrate of a stainless steel sheet.

Initially, substrates were manufactured.

As shown in Table 1, SUS stainless steel sheets (not illustrated) each having a thickness of 0.15 mm and a size of 50×50 mm$^2$ were obtained from a rolled stainless steel slab by bright annealing or anneal-pickling, and by a subsequent process for achieving a desired surface configuration which comprises one or more treatments optionally selected from etching, skin pass rolling, surface polishing, and surface treatments such as an ultrasonic treatment with acid.

Figure 5A:
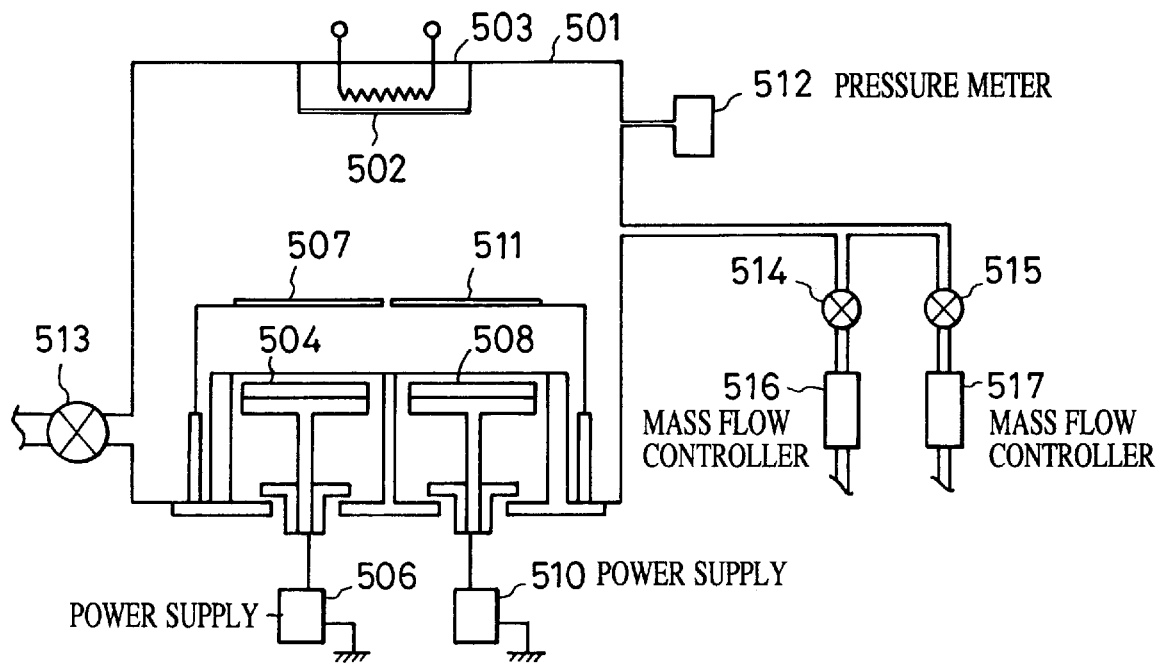
FIG. 5 contains 2 drawings, FIG. 5A which schematically shows is a sputtering system suitable to deposit the back reflector of a photovoltaic cell according to the present invention, and FIG. 5B which schematically shows an etching system suitable to treat the back reflector of a photovoltaic cell according to the present invention.

Next, for each stainless steel sheet, a back reflector was provided according to the specifications described in Table 1 using a sputtering apparatus shown in FIG. 5A. Specifically, as shown in FIG. 5A, a substrate 502 of the stainless steel sheet was set in close contact to a surface of a heater 503, and a deposition chamber 501 was evacuated through an air outlet connected to an oil diffusion pump. When the substrate temperature reached the predetermined temperature described in Table 1, and the pressure was reduced to 1×10$^{-6}$ Torr, a valve 514 was opened and a mass flow controller 516 was controlled to feed Ar gas at 10 to 50 sccm, and the pressure was adjusted at 3 to 10 mTorr with a conductance valve 513. From a power supply 506, DC power of −350 to −450 V or RF power of 200 to 500 W was applied to a target 504 to generate Ar plasma. A target shutter 507 was opened to deposit a reflecting layer, and the target shutter was closed to extinguish plasma when the thickness iof the reflecting layer reached 50 to 100 nm, thus completing manufacture of a back reflector according to the specifications described in Table 1.

Several samples were obtained by employing different parameters in the above-described procedure. Some of the substrates each provided with a back reflector as above were examined for diffuse reflectance. An integrating sphere was used for measuring diffuse reflectance. Incident light from the integrating sphere through an opening is reflected by the substrate which is provided with a back reflector and disposed at an opposite opening The light regularly reflected into the integrating sphere is absorbed with a black substance. The diffusively reflected light reaches a spectrophotometer (Hitachi U40co) disposed above the integrating sphere. Intensity of 800 nm light was measured with the spectrophotometer, and the intensity ratio of the diffusively reflected light to the incident light is the diffuse reflectance.

Next, a transparent conductive layer was provided for each substrate which had been provided with a back reflector as described above. Initially, Ar gas was fed into the deposition chamber at 4 to 40 sccm, the substrate temperature was set at 200 to 450° C., the pressure was set at 5 to 20 mTorr, and DC power of −350 to −450 V or RF power of 100 to 400 W was applied from a power supply 510 to a ZnO target 508 to generate Ar plasma. A target shutter 511 was then opened to deposit a ZnO thin film layer, and the shutter was closed to extinguish plasma when the thickness of the thin film layer reached 0.5 to 2.0 μm, thus completing manufacture of a transparent conductive layer. Several samples were obtained by employing different parameters in the above-described procedure.

Some of the above-manufactured transparent conductive layers were further subjected to surface etching according to the specifications described in Table 1. Specifically, etching was performed as follows.

Figure 5B:
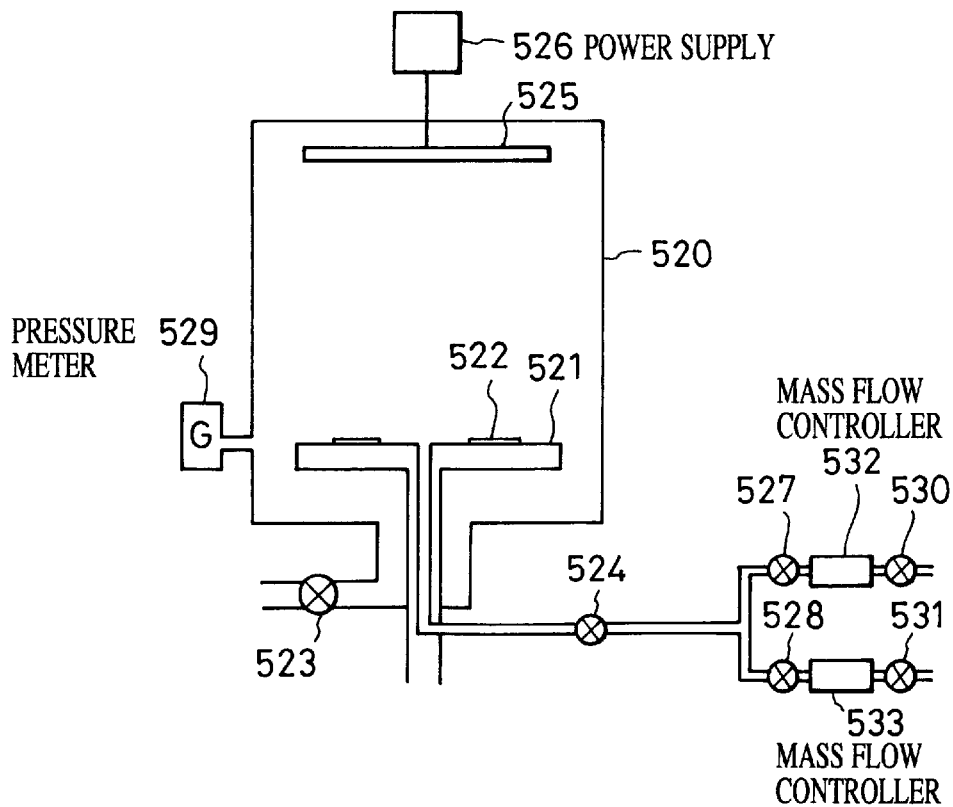

Initially, a substrate laminate 522 comprising a stainless steel substrate and a transparent conductive layer as well as a back substrate prepared as described above was placed in close contact to a heater 521 of an etching apparatus shown in FIG. 5B, and a deposition chamber 520 was evacuated through an air outlet connected to an oil diffusion pump. When the substrate temperature became stable at a predetermined temperature, and the pressure was reduced to $1 \times 10^{-6}$ Torr, valves 524, 527 and 530 were opened and a mass flow controller 532 was controlled to feed etching gas at 5 to 100 sccm, and the pressure was adjusted at 1 to 20 mTorr with a conductance valve 523. From a power supply 526, DC power of −350 to −450 V or RF power of 200 to 500 W was applied to an electrode 525 to generate Ar plasma. After plasma generation was maintained for a predetermined time period, plasma was extinguished to stop surface treatment on the transparent conductive layer. Several samples were obtained by employing different parameters in the above-described procedure.

Subsequent to the step for forming the transparent conductive layer, some of the above-obtained substrate laminates were subjected to surface observation using a scanning electron microscope (SEK). From the results, some samples were found to have conical or pyramidal holes.

Next, for each substrate laminate obtained above, n-type, i-type, and p-type semiconductor layers were formed in that order on the transparent conductive layer comprising a ZnO thin film using a multichamber-type depositing system shown in FIG. 6 (hereinafter, each semiconductor layer is referred to as n-layer, i-layer, or p-layer, respectively). The n-layer was formed with a-Si by RF plasma CVD, the p-layer was formed with μc-Si by RF plasma CVD, and the i-layer was formed with a-Si by RF plasma CVD and MW plasma CVD according to the following procedure.

Initially, all carrier units and deposition chambers were evacuated to a pressure of the order of $10^{-6}$ Torr. The substrate laminate was set in a holder 690 and placed in a load-lock chamber 601. The load-lock chamber was then evacuated to a pressure of the order of $10^{-3}$ Torr using a mechanical booster pump/rotary pump system (not illustrated), and further evacuated to a pressure of the order of $10^{-6}$ Torr using a turbo molecular pump. Next, a gate valve 606 was opened to transfer the holder 690 into a transportation chamber 602 before n-layer deposition, and then the gate valve 606 was closed. Next, the substrate laminate was transferred to beneath a substrate heater 610, hydrogen gas was made to flow to achieve almost the same pressure as that for deposition, the substrate was heated by the substrate heater 610 up to the predetermined temperature described in Table 1, and the substrate temperature was stabilized thereat. Material gas for n-layer deposition as described in Table 1 was then fed into a deposition chamber 617 through mass flow controllers 636 to 639 and stop valves 630 to 634 and 641 to 644. REF power described in Table 1 was applied from an RF generator 622 to an RF-introducing cup 620. Deposition was then performed for a desired time period to obtain an n-layer having the thickness described in Table 1. After this, the feeding of the material gas for n-layer deposition was stopped, and a vacuum was drawn to a pressure of the order of $10^{-6}$ using a turbo molecular pump.

Next, the substrate heater 610 was moved upward, a gate valve 607 was opened, the holder was transferred into a transportation chamber 603 before MW or RF i-layer deposition, and the gate valve 607 was closed. The substrate laminate was then transferred to beneath a substrate heater 611, the substrate heater 611 was moved downward to heat the substrate up to the predetermined substrate temperature described in Table 1, the temperature was stabilized thereat, and an RF i-layer was deposited. For depositing the RF i-layer, material gas for RF i-layer deposition as described in Table 1 was fed into a deposition chamber 618 through gas-feeding equipment for MW or RF i-layer deposition (a gas-feeding pipe 649, stop valves 650 to 655 and 661 to 665, and mass flow controllers 656 to 660). At this time, the pressure was adjusted to the predetermined vacuum degree for RF i-layer deposition described in Table 1. RF power was then applied-from an RF generator 624 to a bias electrode 628, and RF plasma CVD was performed to obtain the RF i-layer having a thickness described in Table 1 on the above-obtained n-layer. After this, the feeding of material gas was stopped, and the deposition chamber was evacuated to a pressure of the order of $10^{-6}$ Torr using a turbo molecular pump. At the same time, the substrate temperature was changed to a temperature suitable for MW i-layer deposition as described in Table 1, and maintained thereat.

Next, material gas suitable for MW i-layer deposition as described in Table 1 was fed into the deposition chamber 618 through gas-feeding equipment for MW or RF i-layer deposition. Using an evacuating unit such as a diffusion pump (not illustrated), the vacuum degree in the deposition chamber was maintained at the degree described in Table 1. At this time, a shutter 695 was closed. MW power described in Table 1 was then applied from an MW generator (not illustrated) to the deposition charter 618 through a waveguide 626 and a microwave-introducing window 525. At the same time, bias power described in Table 1 was applied from the RF generator 624 to the bias electrode 628. A shutter 695 was then opened, and-MW plasma CVD according to the present invention was performed to deposit an MW i-layer on the substrate laminate. During deposition, material gas suitable for MW i-layer deposition was fed into the deposition chamber 618 through gas-feeding equipment for MW or RF i-layer deposition. After an MW i-layer having a predetermined thickness was deposited, the shutter was closed, application of MW power and others were stopped, and the feeding of material gas was stopped. The deposition chamber 618 was then evacuated to $10^{-6}$ Torr using a turbo molecular pump.

Similar to RF i-layer deposition described above, another RF i-layer was deposited on the MW i-layer under the conditions described in Table 1. After deposition of the RE i-layer was completed, the deposition chamber was also evacuated to a pressure of the order of $10^{-6}$ Torr. The substrate heater 611 was then moved away from the substrate laminate, a gate valve 608 was opened to transfer the holder 690 into a transportation chamber 604 before p-layer deposition, and then the gate valve 608 was closed.

Next, the substrate laminate was transferred to beneath a substrate heater 612, and the substrate temperature was set at the predetermined temperature specified in Table 1 and stabilized thereat. Hydrogen gas was then fed under the conditions described in Table 1, and RF power specified in Table 1 was applied to a deposition chamber 619 to generate hydrogen plasma. After the hydrogen plasma treatment was completed, material gas for p-layer deposition was fed into the deposition chamber 619 through gas-feeding equipment for p-layer deposition (stop valves 670 to 674 and 681 to 684, and mass flow controllers 676 to 679). Using an evacuating pump (not illustrated), the vacuum degree in the deposition chamber was adjusted at the degree described in Table 1. RF power described in Table 1 was applied from an RF generator 623 to an RF-introducing cup 621, and RF plasma CVD was then performed to obtain a p-layer having the thickness described in Table 1.

According to the above-described procedure, a pin structure could be formed on a substrate laminate.

After that, feed of material gas was stopped, and hydrogen gas was made to flow for 5 min. The feeding of hydrogen gas was then stopped, the deposition chamber and the gas pipes were evacuated to $1 \times 10^{-5}$ Torr, and the substrate laminate was transferred into an unload chamber 605. The substrate laminate was then sufficiently cooled, and taken out.

Next, in order to provide a transparent electrode on the p-layer, the indium oxide described in Table 1 was deposited according to resistance heating evaporation.

Figure 4:
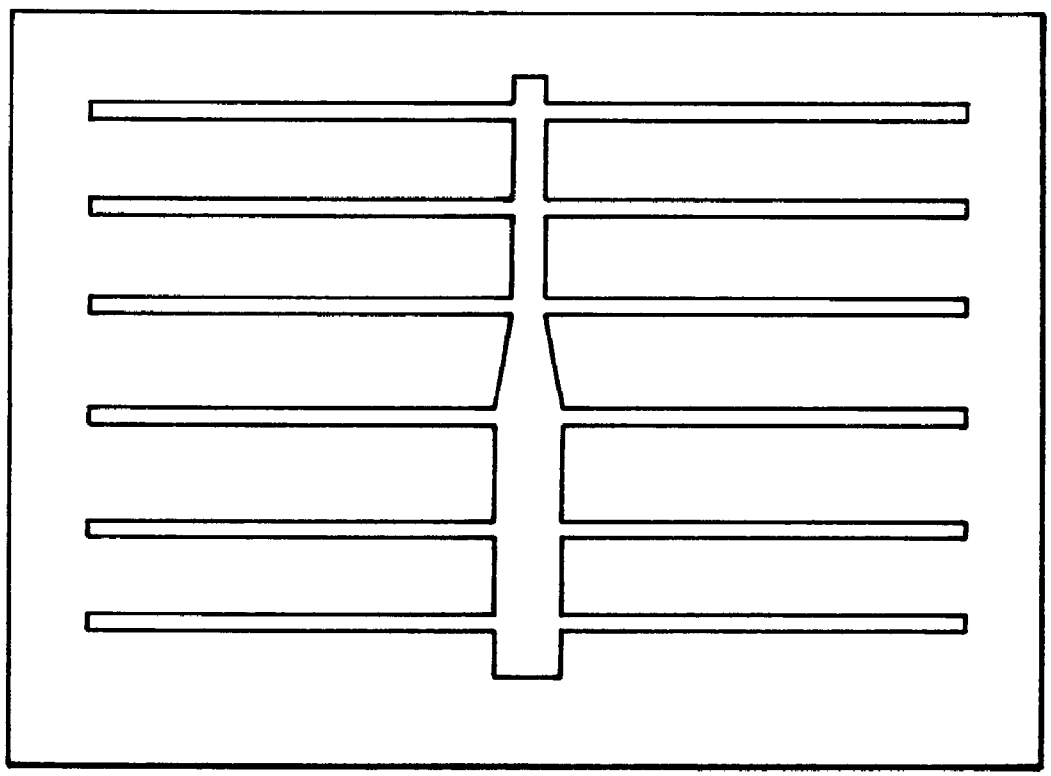
FIG. 4 schematically shows a collecting electrode of a photovoltaic cell according to the present invention.

Finally, a comb-shaped collecting electrode as shown in FIG. 4 which had a structure of Cr/Ag/Cr as specified in Table 1 was deposited on the transparent electrode by vacuum evaporation using a mask which had a comb-shaped slit.

According to the above-described process, the manufacture of photovoltaic cells having a structure shown in FIG. 1 was completed.

TABLE 1

| Substrate | |
|---|---|
| SUS Treatment | Rolling/Bright Annealing or Annealing/Pickling |
| Etching | Done or Not done |
| Skin Pass Rolling | Done or Not done |
| Surface Polishing | Mechanical Polishing (Belt Polishing, Buffing, or Barrel Polishing); Electrolytic Polishing; or Not done |
| Surface Treatment | Solution of Hydrofluoric acid and Nitric acid ($HF:HNO_3:H_2O = 1:3:1$ to 15) with Ultrasonic Treatment for 5 to 300 sec. |
| Metallic Back Reflector | Al; Thickness = 50 to 100 nm; Substrate Temperature = RT to 100° C. |
| Transparent Conductive Layer | ZnO; Thickness = 0.5 to 2.0 μm; Substrate Temperature = 200° C. |
| Surface Treatment | Not done; RF Plasma Etching; Gas Etching; RF Plasma Etching + Annealing; or Gas Etching + Annealing |
| n-Layer | $Si_2H_6$ = 1 sccm; $H_2$ = 50 sccm; $PH_3$ (diluted with $H_2$ to 1%) = 0.5 sccm; Pressure = 1.0 Torr; RF Power = 1.5 W; Substrate Temperature = 350° C.; Thickness = 20 nm |
| RF i-Layer | $Si_2H_6$ = 4 sccm; $H_2$ = 110 sccm; Pressure = 0.5 Torr; RF Power = 2.0 W; Substrate Temperature = 300° C.; Thickness = 10 nm |
| MW i-Layer | $SiH_4$ = 40 sccm; $GeH_4$ = 40 sccm; $H_2$ = 150 sccm; Pressure = 8 mTorr; MW Power = 200 W; RF Bias Power = 700 W; Substrate Temperature = 380° C.; Thickness = 70 nm |
| RF i-Layer | $Si_2H_6$ = 4 sccm; $H_2$ = 110 sccm; Pressure = 0.5 Torr; RF Power = 2.0 W; Substrate Temperature = 300° C.; Thickness = 20 nm |
| Hydrogen Plasma | $H_2$ = 80 sccm; Pressure = 2.0 Torr; RF Power = 30 W; Substrate Temperature = 200° C. |
| p-Layer | $SiH_4$ (diluted with $H_2$ to 10%) = 0.25 sccm; $H_2$ = 35 sccm; $BF_3$ (diluted with $H_2$ to 2%) = 2 sccm; Pressure = 2 Torr; RF Power = 30 W; Substrate Temperature = 200° C.; Thickness = 10 nm |
| Transparent Electrode | $In_2O_3$; Reactive Vapor Deposition; Thickness = 70 nm |
| Collecting Electrode | Cr (100 nm)/Ag (1 μm)/Cr (100 nm) |

The results of several examinations on characteristics of the above-obtained photovoltaic cells will be shown below.

At first, diffuse reflectance values of the substrates each provided with a metallic back reflector were measured. The measured diffuse reflectance values fell within a range of 1 to 55% depending on the methods for surface-treating the stainless steel sheets or the conditions for forming the back reflectors.

The transparent conductive layers were found to have several surface configurations according to the surface configuration of the stainless steel sheet after surface treatment, the material or configuration of the back reflector, the thickness of the transparent conductive layer, and the deposition rate or temperature for forming the transparent conductive layer. Among the surface configurations, conical holes and pyramidal holes were noted, and the obtained photovoltaic cells were classified into two groups, a group of photovoltaic cells each having conical or pyramidal holes on the surface of the transparent conductive layer and a group of those without such holes.

Next, measurements of initial photoelectric conversion efficiency (photoelectromotive force/incident light force) were performed, and further, photo-aging tests and high-temperature high-humidity reversed-bias (HHRB) aging tests were carried out. For the above measurements or tests, three photovoltaic cells were prepared for each type of photovoltaic cell obtained above. Each of the prepared photovoltaic cells was further divided into 10 sub-cells, and subjected to the above measurements or tests.

Initial photoelectric conversion efficiency was measured by irradiating each photovoltaic sub-cell with AM-1.5 light (100 mW/cm$^2$) to measure the V-I characteristic.

The photo-aging test for each photovoltaic sub-cell was performed as follows: The photovoltaic sub-cell, the initial conversion efficiency of which had been measured beforehand, was placed in an atmosphere of 50% humidity at 50° C.; and irradiated with AM-1.5 light for 500 hours. Conversion efficiency under AM-1.5 light after this photo-aging was then measured, and the drop of photoelectric conversion efficiency was calculated according to the formula, (Photoelectric Conversion Efficiency after Photo-aging) (Initial Photoelectric Conversion Efficiency).

The HHRB aging test for each photovoltaic sub-cell was performed as follows: The photovoltaic sub-cell, the initial conversion efficiency of which had been measured beforehand, was placed in a dark atmosphere of 80% humidity at 80° C., and subjected to application of a reversed bias of 0.7 V for 200 hours. Conversion efficiency under AM-1.5 light after this HHRB aging was then measured, and the drop of photoelectric conversion efficiency was calculated according to the formula, (Photoelectric Conversion Efficiency after HHRB Aging)/(Initial Photoelectric Conversion Efficiency).

Figure 8A:
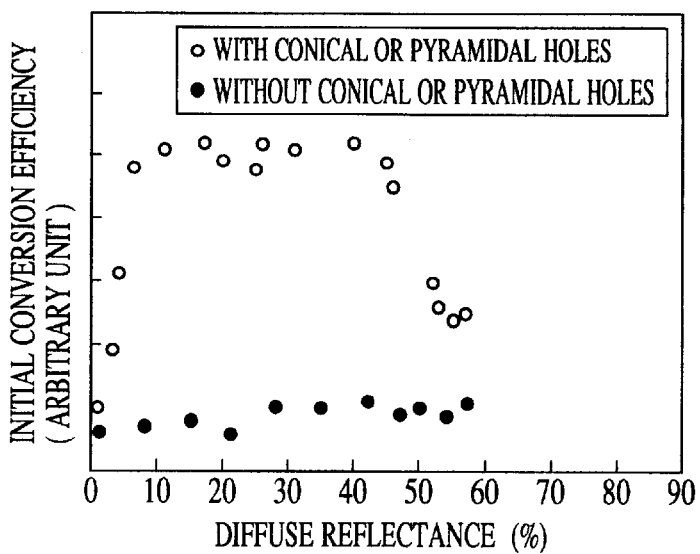
FIG. 8 contains 3 drawings, FIG. 8A which is a graph showing the relationship between initial conversion efficiency and diffuse reflectance in each of photovoltaic cells obtained in Example 1 according to the present invention and conventional photovoltaic cells, FIG. 8B which is a graph showing the relationship between conversion efficiency after a photo-aging test and diffuse reflectance in each of photovoltaic cells obtained in Example 1 according to the present invention and conventional photovoltaic cells, and FIG. 8C which is a graph showing the relationship between conversion efficiency after an HHRB aging test and diffuse reflectance in each of photovoltaic cells obtained in Example 1 according to the present invention and conventional photovoltaic cells.
Figure 8B:
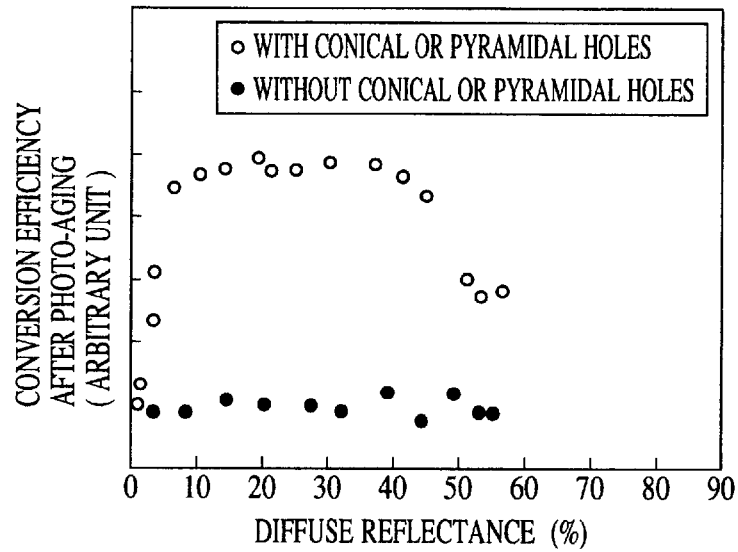
Figure 8C:
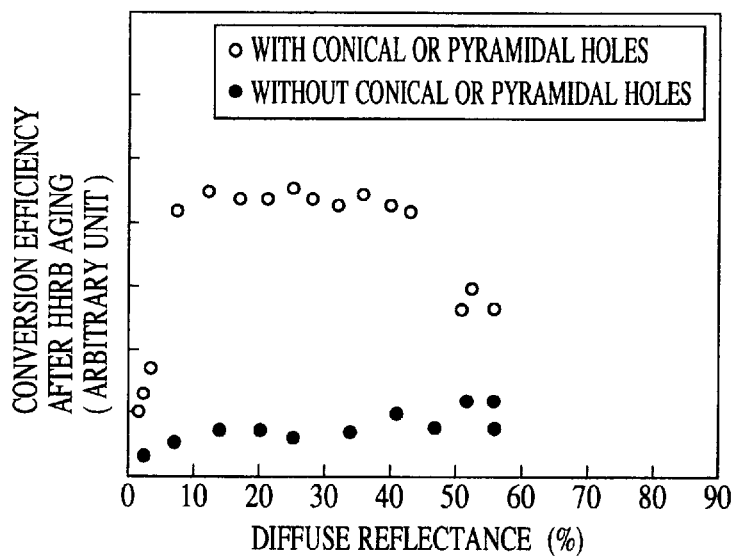

The results of the above measurements and tests are shown in FIGS. 8A, 8B, and 8C, respectively. A specific arbitrary unit is used for each photoelectric conversion efficiency value.

From the above results, it has been revealed that each photovoltaic cell having conical or pyramidal holes can exhibit satisfactory initial photoelectric conversion efficiency when the diffuse reflectance on the back reflector is 3 to 50%. This can be attributed principally to improvement in open circuit voltage (Voc) and fill factor (FF). In contrast, photovoltaic cells without conical or pyramidal holes were found to generally exhibit low initial photoelectric conversion efficiencies as compared to those having such holes.

Further, in a comparison within photovoltaic cells having such holes, the photovoltaic cells having diffuse reflectance values on their back reflectors below 3% or above 50% exhibited low conversion efficiency values after photo-aging as compared with those having diffuse reflectance values on their back reflectors of 3% to 50%. The low conversion efficiency values in those having diffuse reflectance values below 3% may be attributed to an increase in series resistance due to peeling, while the low conversion efficiency values in those having diffuse reflectance values above 50% may be attributed to a decrease in shunt resistance due to the properties of their textured structures.

As to the HHRB tests, results similar to those in the photo-aging tests were obtained.

As described above, the photovoltaic cells according to the present invention, each of which had diffuse reflectance on its back reflector of 3% to 50% and had a transparent conductive layer having conical or pyramidal holes dispersed on the surface, were found to exhibit excellent characteristics as compared with conventional photovoltaic cells.

Example 2

Optimum d, C1 and C2 Values

Combinations of conditions for achieving a back reflector diffuse reflectance of 3 to 50% and for achieving a transparent conductive layer having conical or pyramidal holes were selected from among the conditions employed in Example 1, such as the treatment conditions for the SUS substrate sheets, and the manufacturing conditions for the metallic back reflectors and the transparent conductive layers. Additionally, those combinations of conditions were further specified and combined with other treatments as shown in Table 2-1. According to such conditions, photovoltaic cells were manufactured, each of which had a structure shown in FIG. 1 and comprised a substrate having a thickness of 0.20 mm and a size of 50×50 mm².

Initially, substrates were manufactured.

Stainless steel slabs were SUS treated according to the conditions described in Table 2-1, and further subjected to etching, surface polishing, and other treatments.

Next, similar to the procedure in Example 1, a metallic back reflector and a transparent conductive layer were provided for each substrate using a sputtering apparatus as shown in FIG. 5A under the conditions described in Table 2-1.

Next, for each stainless steel sheet, a back reflector was provided according to the specifications described in Table 1 using a sputtering apparatus shown in FIG. 5A.

Further, some of the above-obtained substrate laminates were subjected to surface etching of the conductive layers according to the conditions described in Table 2-1.

At this point, some of the above-obtained substrate laminates was sampled for examination, and others were subjected to deposition of semiconductor layers.

In a manner similar to that in Example 1 under the conditions described in Table 2-1, each of the substrate laminates was provided with a pin-type semiconductor layer (photoelectric conversion layer), an $In_2O_3$ transparent electrode, and a collecting electrode to manufacture a photovoltaic cell.

TABLE 2-1

| Substrate | |
| --- | --- |
| SUS Treatment | Rolling/Bright Annealing or Annealing/Pickling |
| Etching | Done or Not done |
| Skin Pass Rolling | Done or Not done |
| Surface Polishing | Mechanical Polishing (Belt Polishing, Buffing, or Barrel Polishing); Electrolytic Polishing; or Not done |
| Surface Treatment | Solution of Hydrofluoric acid and Nitric acid ($HF:HNO_3:H_2O$ = 1:3:1 to 15) with Ultrasonic Treatment for 5 to 300 sec. |
| Metallic Back Reflector | Al; Thickness = 50 to 100 nm; Substrate Temperature = RT to 100° C. |
| Transparent Conductive Layer | ZnO; Thickness = 0.5 to 2.0 μm; Substrate Temperature = 200° C. |
| Surface Treatment | Not done; RF Plasma Etching; RF Power = 100 to 600 W for 5 to 80 min. Substrate Temperature = RT to 200° C. Gas Etching; RF Plasma Etching as above + Annealing; or Gas Etching + Annealing |
| n-Layer | $Si_2H_6$ = 1 sccm; $H_2$ = 50 sccm; $PH_3$ (diluted with $H_2$ to 1%) = 0.5 sccm; Pressure = 1.2 Torr; RF Power = 2 W; Substrate Temperature = 330° C.; Thickness = 20 nm |
| RF i-Layer | $Si_2H_6$ = 4 sccm; $H_2$ = 90 sccm; Pressure = 0.5 Torr; RF Power = 1.7 W; Substrate Temperature = 300° C.; Thickness = 10 nm |
| MW i-Layer | $SiH_4$ = 40 sccm; $GeH_4$ = 40 sccm; $H_2$ = 150 sccm; Pressure = 8 mTorr; MW Power = 200 W; RF Bias Power = 700 W; Substrate Temperature = 380° C.; Thickness = 70 nm |
| RF i-Layer | $Si2H6$ = 4 sccm; $H_2$ = 110 sccm; Pressure = 0.5 Torr; RF Power = 2.0 W; Substrate Temperature = 300° C.; Thickness = 20 nm |
| Hydrogen Plasma Treatment | $H_2$ = 80 sccm; Pressure = 2.0 Torr; RF Power = 30 W; Substrate Temperature = 200° C. |
| p-Layer | $SiH_4$ (diluted with $H_2$ to 10%) = 0.25 sccm; $H_2$ = 35 sccm; $BF_3$ (diluted with $H_2$ to 2%) = 2 sccm; Pressure = 2 Torr; RF Power = 30 W; Substrate Temperature = 200° C.; Thickness = 10 nm |
| Transparent Electrode | $In_2O_3$; Reactive Vapor Deposition; Thickness = 70 nm |
| Collecting Electrode | Cr (100 nm)/Ag (1 μm)/Cr (100 nm) |

Each of the photovoltaic cells manufactured according to the several above-described conditions was divided into ten sub-cells and subjected to yield examination, measurement for initial photoelectric conversion efficiency, an adhesion test, an HHRB aging test, and a cyclic high-temperature high-humidity (HTHH) aging test.

The adhesion test was performed as follows: Each photovoltaic sub-cell was inscribed in a grid pattern having 100 squares surrounded with lines at an interval of 1 mm; cellophane self-adhering tape was then stuck on the cell; after the tape sufficiently adhered to the cell, the tape was ripped off from the cell; and a peeled area of the cell was measured The cyclic HTHH aging test was performed as follows: Each photovoltaic sub-cell, the initial photoelectric conversion efficiency of which had been measured beforehand, was placed and left standing in a dark space at 80° C. and 80% humidity for 4 hours; after this, the temperature was reduced to −30° C. over a period of 90 min, and retained thereat for 30 min.; the temperature was then increased back to 80° C.; after the above-described cycle was repeated 15 times, photoelectric conversion efficiency after HTHH aging was measured under AM-1.5 light, and the drop of the photoelectric conversion efficiency was calculated according, to the formula, (Photoelectric Conversion Efficiency after Cyclic HTHH Aging)/(Initial Photoelectric Conversion Efficiency).

Previous to the above-mentioned examinations and tests, the substrate laminates just before the process for forming semiconductor layers were subjected to surface observation similar to Example 1. Using a surface-roughness tracer, the average diameter d ($\mu$m) and depth ($\mu$m) of the conical or pyramidal holes on the transparent conductive layer of each laminate was measured, and the coefficient C1 ($\equiv$h/d) was calculated. Additionally, during surface observation, the numbers of the conical or pyramidal holes within 50×50 $\mu$m areas on the transparent conductive layer were measured to determine the average density $\rho$, and the coefficient C2 ($\equiv \rho \times d^2$) was calculated. As a result, each average diameter d of the conical or pyramidal holes fell within 0.03 to 5 $\mu$m.

Based on this result, the photovoltaic cells, in which the average diameter of the conical or pyramidal holes on the transparent conductive layers fell within 0.03 to 5 $\mu$m, were subjected to evaluation of characteristics by means such as the above-described examinations or tests regardless of the values of coefficients C1 and C2.

The results are shown in Table 2-2 in which each unit is specified for each item.

As is obvious from the results, the photovoltaic cells in which the average diameter of the conical or pyramidal holes falls within 0.05 to 2 $\mu$m exhibit excellent characteristics. In contrast, similar to the photovoltaic cells without conical or pyramidal holes, the photovoltaic cells in which the average diameter of the conical or pyramidal holes is less than 0.05 $\mu$m exhibit low characteristics due to increased serial resistance which may be caused by peeling, i.e., low adhesion. On the other hand, the photovoltaic cell in which the average diameter of the conical or pyramidal holes is above 2 $\mu$m exhibits low characteristics due to decreased Jsc.

Based on these results, the substrate laminates in which the average diameter of the conical or pyramidal holes on the transparent conductive layers fell within 0.05 to 2 pm were selected and examined for the coefficients C1 and C2. As a result, the coefficient C1 values fell within 0.1 to 1.5, and the coefficient C2 values fell within 0.01 to 1.5.

Next, the photovoltaic cells, which comprised the substrate laminates having the above-described coefficient values, were examined for initial photoelectric conversion efficiency and subjected to HHRB aging tests and HTHH aging tests in order to evaluate their characteristics.

The results are shown in Tables 2-3 to 2-5 in which each unit is specified for each item.

As is obvious from the results, the photovoltaic cells in which the coefficient C1 falls within 0.2 to 0. 9, while the coefficient C2 falls within 0.02 to 1.0 exhibit excellent characteristics in all respects. In contrast, the photovoltaic cells in which the coefficient C1 or C2 is below 0.2 or 0.02, respectively, exhibit low characteristics due to decreased Jsc. On the other hand, the photovoltaic cells in which the coefficient C1 or C2 is above 0.9 or 1.0, respectively, exhibit low characteristics due to decreased Voc and FF.

As described above, photovoltaic cells of the present invention each comprising a substrate laminate in which the average diameter of conical or pyramidal holes falls within 0.05 to 2.0 $\mu$m, and the coefficients C1 and C2 fall within 0.2 to 0.9 and 0.02 to 1, respectively, were found to exhibit excellent characteristics.

TABLE 2-2

| Average Diameter d ($\mu$m) | 0.03 | 0.05 | 0.10 | 0.30 | 1.00 | 2.00 | 2.05 | 2.50 | 3.05 | 5.00 |
|---|---|---|---|---|---|---|---|---|---|---|
| Yield | 0.86 | 1.01 | 1.02 | 1.01 | 1.01 | 1.00 | 0.89 | 0.88 | 0.85 | 0.86 |
| Initial Conversion Efficiency | 0.90 | 1.01 | 1.00 | 1.00 | 1.00 | 1.02 | 0.90 | 0.88 | 0.90 | 0.87 |
| Adhesion | 0.80 | 1.00 | 1.01 | 1.00 | 1.02 | 1.01 | 0.93 | 0.92 | 0.90 | 0.92 |
| Conversion Efficiency after HHRB Aging | 0.81 | 1.00 | 1.00 | 1.01 | 1.00 | 1.01 | 0.89 | 0.88 | 0.85 | 0.85 |
| Conversion Efficiency after Cyclic HTHH Aging | 0.82 | 1.01 | 1.01 | 1.00 | 1.01 | 1.01 | 0.92 | 0.88 | 0.89 | 0.88 |

TABLE 2-3

Initial Photoelectric Conversion efficiency

| C2\C1 | 0.10 | 0.18 | 0.20 | 0.50 | 0.70 | 0.90 | 0.95 | 1.20 | 1.50 |
|---|---|---|---|---|---|---|---|---|---|
| 0.01  | 0.85 | 0.85 | 0.84 | 0.83 | 0.82 | 0.84 | 0.86 | 0.85 | 0.83 |
| 0.015 | 0.83 | 0.84 | 0.86 | 0.83 | 0.85 | 0.85 | 0.83 | 0.82 | 0.82 |
| 0.02  | 0.83 | 0.85 | 1.01 | 1.02 | 1.00 | 1.02 | 0.88 | 0.86 | 0.85 |
| 0.55  | 0.83 | 0.85 | 1.02 | 1.01 | 1.02 | 1.02 | 0.89 | 0.90 | 0.90 |
| 0.80  | 0.87 | 0.89 | 1.02 | 1.01 | 1.01 | 1.00 | 0.92 | 0.90 | 0.92 |
| 1.00  | 0.88 | 0.89 | 1.01 | 1.02 | 1.01 | 1.02 | 0.90 | 0.93 | 0.90 |
| 1.05  | 0.89 | 0.91 | 0.89 | 0.95 | 0.90 | 0.92 | 0.89 | 0.88 | 0.87 |
| 1.10  | 0.90 | 0.91 | 0.90 | 0.90 | 0.90 | 0.89 | 0.88 | 0.87 | 0.87 |
| 1.50  | 0.90 | 0.89 | 0.88 | 0.88 | 0.87 | 0.86 | 0.87 | 0.85 | 0.85 |

TABLE 2-4

Photoelectric Conversion efficiency after HHRB Aging

| C2\C1 | 0.10 | 0.18 | 0.20 | 0.50 | 0.70 | 0.90 | 0.95 | 1.20 | 1.50 |
|---|---|---|---|---|---|---|---|---|---|
| 0.01  | 0.82 | 0.82 | 0.80 | 0.81 | 0.81 | 0.83 | 0.82 | 0.82 | 0.83 |
| 0.015 | 0.81 | 0.85 | 0.86 | 0.82 | 0.83 | 0.88 | 0.85 | 0.83 | 0.82 |
| 0.02  | 0.83 | 0.85 | 1.00 | 1.01 | 1.01 | 1.02 | 0.86 | 0.85 | 0.87 |
| 0.55  | 0.87 | 0.85 | 1.00 | 1.02 | 1.02 | 1.02 | 0.89 | 0.87 | 0.88 |
| 0.80  | 0.88 | 0.90 | 1.00 | 1.01 | 1.02 | 1.01 | 0.88 | 0.88 | 0.86 |
| 1.00  | 0.85 | 0.89 | 1.01 | 1.02 | 1.01 | 1.02 | 0.98 | 0.88 | 0.87 |
| 1.05  | 0.85 | 0.86 | 0.88 | 0.86 | 0.89 | 0.90 | 0.90 | 0.88 | 0.86 |
| 1.10  | 0.85 | 0.88 | 0.88 | 0.89 | 0.87 | 0.87 | 0.88 | 0.86 | 0.85 |
| 1.50  | 0.89 | 0.85 | 0.86 | 0.84 | 0.85 | 0.86 | 0.89 | 0.90 | 0.87 |

TABLE 2-5

Photoelectric Conversion efficiency after Cyclic High-Temperature High-Humidity (HTHH) Aging

| C2\C1 | 0.10 | 0.18 | 0.20 | 0.50 | 0.70 | 0.90 | 0.95 | 1.20 | 1.50 |
|---|---|---|---|---|---|---|---|---|---|
| 0.01  | 0.82 | 0.82 | 0.80 | 0.80 | 0.80 | 0.79 | 0.79 | 0.78 | 0.80 |
| 0.015 | 0.82 | 0.81 | 0.83 | 0.82 | 0.84 | 0.82 | 0.83 | 0.85 | 0.82 |
| 0.02  | 0.82 | 0.84 | 1.00 | 1.01 | 1.02 | 1.00 | 0.85 | 0.86 | 0.89 |
| 0.55  | 0.84 | 0.86 | 1.01 | 1.02 | 1.00 | 1.02 | 0.85 | 0.86 | 0.84 |
| 0.80  | 0.84 | 0.86 | 1.01 | 1.02 | 1.00 | 1.01 | 0.86 | 0.85 | 0.84 |
| 1.00  | 0.88 | 0.89 | 1.00 | 1.00 | 1.01 | 1.00 | 0.89 | 0.87 | 0.86 |
| 1.05  | 0.86 | 0.85 | 0.84 | 0.86 | 0.85 | 0.84 | 0.85 | 0.86 | 0.87 |
| 1.10  | 0.85 | 0.86 | 0.85 | 0.84 | 0.86 | 0.84 | 0.85 | 0.86 | 0.82 |
| 1.50  | 0.89 | 0.85 | 0.86 | 0.83 | 0.84 | 0.87 | 0.8  | 0.85 | 0.84 |

Example 3

Optimum Diffuse Reflectance for Photovoltaic Cells Manufactured by Roll-to-roll Method Solar batteries having a triple stacked structure as shown in FIG. 2 were manufactured using band-shaped sus stainless steel sheets 100 m in length, 30 cm in width and 0.13 mm in thickness, and using a deposition apparatus for a roll-to-roll method as shown in FIG. 7.

Initially, the stainless steel sheets to be used as substrates were obtained similar to the manner in Example 1. Specifically, stainless steel sheets were rolled so as to be 0.13 mm thick, and SUS-treated according to the specifications described in Table 3.

After this, a metallic back reflector was provided on each substrate by a roll-to-roll method under conditions specified in Table 3. Some of the substrate laminates thus obtained were examined for diffuse reflectance, and each of the others was provided with a transparent conductive layer. In some cases, the transparent conductive layer was further surface-treated as the occasion demands.

Some of the substrate laminates thus obtained were left for surface observation, and the others were subjected to a subsequent roll-to-roll method using a CVD apparatus under conditions specified in Table 3 to manufacture photovoltaic cells.

FIG. 7A is a schematic view of a continuous manufacturing system for obtaining photovoltaic cells by a roll-to-roll method. This apparatus comprises a substrate-feeding chamber 729, a plurality of deposition chambers 701 to 713, and a substrate-rewinding chamber 730 disposed in order; and separative passages 714 connecting these chambers, and each deposition chamber has an air outlet for evacuating the chamber to vacuum.

In this system, a band-shaped substrate laminate 740 is fed from the substrate-feeding chamber and rewound to the substrate-rewinding chamber through those deposition chambers and separative passages. At this time, gas materials are introduced from gas inlets at each deposition chamber and each separative passage and removed through each air outlet after depositing each layer. Each deposition chamber is equipped with a halogen lamp heater (not illustrated) for heating the substrate from its back to a predetermined temperature. Further, each deposition chamber is equipped with an RF electrode 717 or a microwave applicator 718, and each gas inlet is connected to a material gas feeding unit (not illustrated). Bias electrodes 720 are disposed in the deposition chambers 703 and 707 for MW i-layer deposition and connected to power. units, namely, RF generators (not illustrated). The substrate-feeding chamber has a feeding roll 721 and a guide roller 722 for appropriately tensing and horizontally holding the substrate. In the substrate-rewinding chamber, a rewinding roll 723 and a guide roller 724 are disposed.

FIG. 7B is a schematic top plan view of the continuous manufacturing system shown in FIG. 7A. Each of the deposition chambers 701 to 713 is equipped with the gas inlet 715 and the exhaust port 716, and the exhaust port is connected to an evacuating pump such as an oil diffusion pump or a mechanical booster pump (not illustrated).

Specifically, using the above-described system, semiconductor layers were deposited as follows.

Initially, a substrate laminate sheet (based on a SUS430BA sheet) was wound into the feeding roll 721 at an average curvature radius of 30 cm and set in the substrate-feeding chamber 710. Through all the deposition chambers, the substrate laminate sheet was partially rewound into the rewinding roll 723 from one end of the sheet.

The entire system was then evacuated to vacuum by the evacuating pumps, the lamp heaters in the deposition chambers were turned on, and the temperature of each deposition chamber was adjusted to a predetermined temperature. When the pressure of the entire system reached 1 mTorr or less, scavenging gas was fed from scavenging-gas inlets 719 as shown in FIG. 7A, and the substrate laminate was then transferred in the direction indicated with the arrows to be rewound by the-rewinding roll. Further, a material gas for each deposition was fed into each deposition chamber. At this time, the flow rate of scavenging gas for each separative passage and the pressure inside each deposition chamber were controlled so that a material gas for a deposition chamber would not be diffused into other deposition chambers.

Next, while plasma was generated by introducing RF power or MW power and RF bias power, a photovoltaic cell comprising three pin junctions was manufactured under conditions specified in Table 3, wherein the first n-layer was deposited in the chamber 701, the first i-layers were deposited in the chambers 702 to 704, and the first p-layer was deposited in the chamber 705 in order to form the third pin junction; the second n-layer was deposited in the chamber 706, the second i-layers were deposited in the chambers 707 to 709, and the second p-layer was deposited in the chamber 710 in order to form the second pin junction; and the third n-layer was deposited in the chamber 711, the third i-layer was deposited in the chamber 712, and the third p-layer was deposited in the chamber 713 in order to form the first pin junction.

After the substrate laminate sheet was completely rewound, MW power, RF power, and plasma were extinguished, and the feeding of material gases and scavenging gas was stopped. The atmosphere of the entire system was then equilibrated with air, and the rewinding roll was removed.

Next, a transparent electrode 213 is provided on the triple pin junctions under conditions shown in Table 3 using a reactive sputtering apparatus.

Next, a wire grid comprising a copper wire material, and a silver cladding layer and a carbon layer with a urethane resin binder which surround the copper wire material is provided on the transparent electrode 213 by heat-melting to form a collecting electrode.

Finally, the above-obtained solar battery roll was cut into a size of 250 mm×100 mm, thus completing manufacture of triple stacked solar batteries according to a roll-to-roll method.

TABLE 3

| Substrate | |
| --- | --- |
| SUS Treatment | Rolling/Bright Annealing or Annealing/Pickling |
| Etching | Done or Not done |
| Skin Pass Rolling | Done or Not done |
| Surface Polishing | Mechanical Polishing (Belt Polishing, Buffing, or Barrel Polishing); Electrolytic Polishing; or Not done |
| Surface Treatment | Solution of Hydrofluoric acid and Nitric acid (HF:HNO$_3$:H$_2$O = 1:3:1 to 15) with Ultrasonic Treatment for 5 to 300 sec. |

TABLE 3-continued

| | |
| --- | --- |
| Metallic Back Reflector | Al; Thickness = 50 to 100 nm; Substrate Temperature = RT to 100° C. |
| Transparent Conductive Layer | ZnO; Thickness = 0.5 to 2.0 μm; Substrate Temperature = 200° C. |
| Surface Treatment | Not done; RF Plasma Etching; Gas Etching; RF Plasma Etching Annealing; or Gas Etching + Annealing |
| Third Pin Junction | |
| First n-Layer | a-Si; Thickness = 20 nm |
| First RF i-Layer | a-Si; Thickness = 10 nm |
| First MW i-Layer | a-SiGe; Thickness = 60 nm |
| Another First RF i-Layer | a-Si; Thickness = 18 nm |
| First p-Layer | μc-Si; Thickness = 15 nm |
| Second Pin Junction | |
| Second n-Layer | a-Si; Thickness = 10 nm |
| Second RF i-Layer | a-Si; Thickness = 10 nm |
| Second MW i-Layer | a-SiGe; Thickness = 50 nm |
| Another Second RF i-Layer | a-Si; Thickness = 18 nm |
| Second p-Layer | μc-Si; Thickness = 15 nm |
| First Pin Junction | |
| Third n-Layer | a-Si; Thickness = 10 nm |
| Third RF i-Layer | a-Si; Thickness = 90 nm |
| Third p-Layer | μc-Si; Thickness = 20 nm |
| Transparent Electrode | ITO; Thickness = 75 nm |
| Collecting Electrode | Cu Wire; Size = 50 μm |

The results of several examinations on characteristics of the above-obtained photovoltaic cells will be shown below.

At first, diffuse reflectance values of the substrates each provided with a metallic back reflector were measured in a manner similar to that in Example 1. The measured diffuse reflectance values fell within a range of 2 to 55% depending on the methods for surface-treating the stainless steel sheets or the materials for the back reflectors.

Similar to the results of Example 1, the transparent conductive layers were found to have several surface configurations according to the surface configuration of the stainless steel sheet after surface treatment, the material or configuration of the back reflector, the thickness of the transparent conductive layer, and the deposition rate or temperature for forming the transparent conductive layer. Further, as in Example 1, the obtained photovoltaic cells were classified into two groups, a group of photovoltaic cells each having conical or pyramidal holes on the surface of the transparent conductive layer and a group of those without such holes.

Next, measurements of initial photoelectric conversion efficiency (photoelectromotive forceincident light force) were performed, and further, photo-aging tests and WHRB aging tests were carried out in a manner similar to that in Example 1. For the above measurements or tests, three photovoltaic cells were prepared for each type of photovoltaic cell obtained above. Each of the prepared photovoltaic cells was further divided into 10 sub-cells and subjected to the above measurements or tests.

Figure 9A:
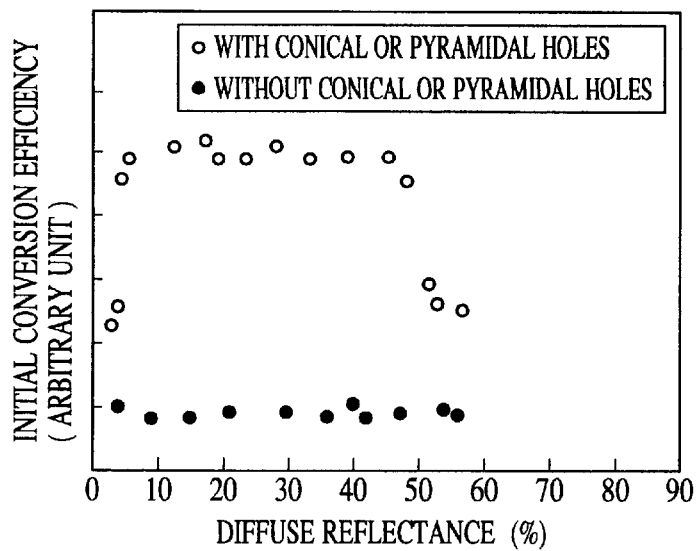
FIG. 9 contains 3 drawings, FIG. 9A which is a graph showing the relationship between initial conversion efficiency and diffuse reflectance in each of photovoltaic cells obtained in Example 3 according to the present invention and conventional photovoltaic cells, FIG. 9B which is a graph showing the relationship between conversion efficiency after a photo-aging test and diffuse reflectance in each of photovoltaic cells obtained in Example 3 according to the present invention and conventional photovoltaic cells, and FIG. 9C which is a graph showing the relationship between conversion efficiency after an HMRB aging test and diffuse reflectance in each of photovoltaic cells obtained in Example 3 according to the present invention and conventional photovoltaic cells.
Figure 9B:
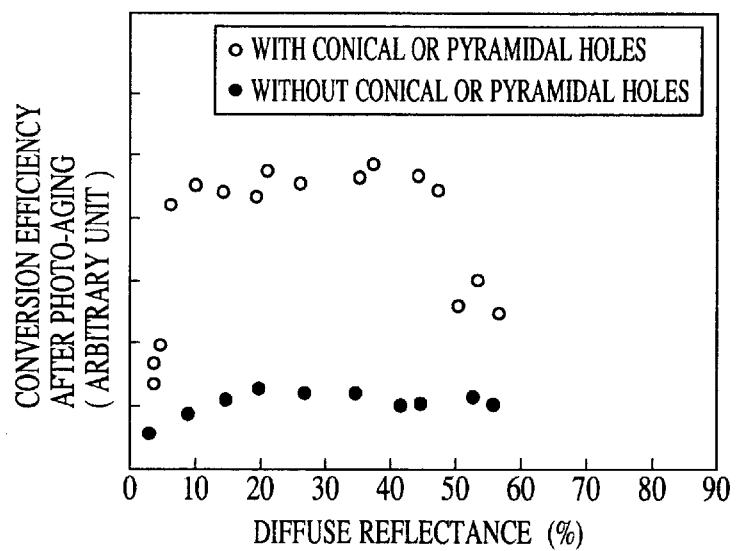
Figure 9C:
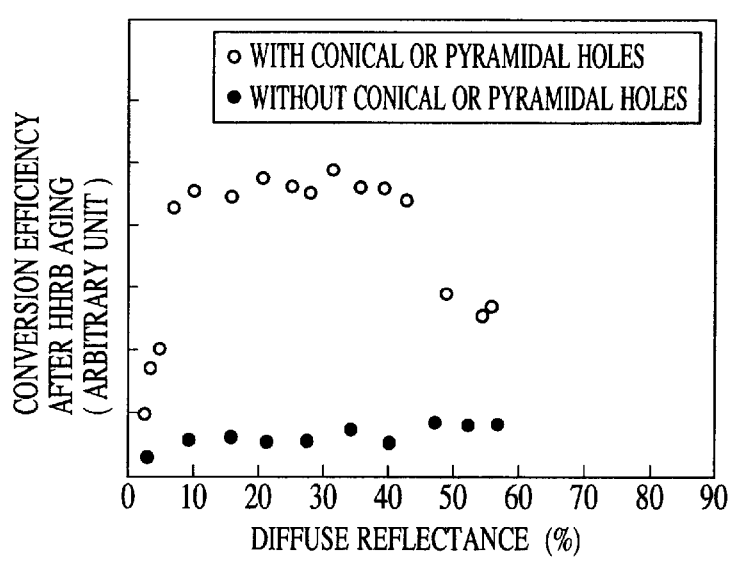

The results of the above measurements and tests are shown in FIGS. 9A, 9B, and 9C, respectively. A specific arbitrary unit is used for each photoelectric conversion efficiency value.

From the above results, similar to Example 1, it has been revealed that each photovoltaic cell having conical or pyramidal holes can exhibit satisfactory initial photoelectric conversion efficiency when the diffuse reflectance on its back reflector is 3 to 50%. This can be attributed principally to improvement in open circuit voltage (Voc) and fill factor (FF). In contrast, photovoltaic cells without conical or pyramidal holes were found to generally have low initial photoelectric conversion efficiencies as compared to those having such holes.

Further, in a comparison within photovoltaic cells having such holes, the photovoltaic cells having diffuse reflectance values on their back reflectors below 3% or above 50% exhibited low conversion efficiency values after photo-aging as compared with those having diffuse reflectance values on their back reflectors of 3% to 50%. The low conversion efficiency values in those having diffuse reflectance values below 3% may be attributed to an increase in series resistance due to peeling, while the low conversion efficiency values in those having diffuse reflectance values above 50% may be attributed to a decrease in shunt resistance due to the properties of their textured structures.

As to the HHRB tests, results similar to those in the photo-aging tests were obtained.

As described above, the photovoltaic cells according to the present invention, each of which had a diffuse reflectance on its back reflector of 3% to 50% and had a transparent conductive layer having conical or pyramidal holes dispersed on the surface, were found to exhibit excellent characteristics as compared with conventional photovoltaic cells.

Example 4

In the same manner as in Example 1, pin-type photovoltaic cells having a structure shown in FIG. 1 were manufactured except that Cu was used for the back reflectors instead of Al.

The diffuse reflectance values of the substrates each provided with a metallic back reflector fell within a range of 2 to 70%.

As in Example 1, the obtained photovoltaic cells were subjected to measurements of initial photoelectric conversion efficiency and HfRB aging tests. As a result, the photovoltaic cells, each of which had diffuse reflectance on its back reflector of 3% to 50% and had a transparent conductive layer having conical or pyramidal holes dispersed on the surface, were found to exhibit excellent characteristics as compared with conventional photovoltaic cells.

Example 5

In the same manner as in Example 1, pin-type photovoltaic cells having a structure shown in FIG. 1 were manufactured except that the structure of the back reflectors was changed from an Al mono-layer to a dual-layer comprising an AlSi layer (10 to 100 nm in thickness, and the substrate temperature for deposition of RT to 100° C.) and an Al layer (50 to 100 nm in thickness, and the substrate temperature for deposition of RT to 150° C.).

The diffuse reflectance values of the substrates each provided with a metallic back reflector fell within a range of 1 to 75%.

As in Example 1, the obtained photovoltaic cells were subjected to measurements of initial photoelectric conversion efficiency and HHRB aging tests. As a result, the photovoltaic cells, each of which had diffuse reflectance on its back reflector of 3% to 50% and had a transparent conductive layer having conical or pyramidal holes dispersed on the surface, were found to exhibit excellent characteristics as compared with conventional photovoltaic cells.

What is claimed is:

1. A photovoltaic cell comprising a substrate, a back reflector, a transparent conductive layer, and a photoelectric conversion layer, wherein diffuse reflectance of said back reflector is 3 to 50% and wherein said transparent conductive layer has holes on its surface.

2. The photovoltaic cell according to claim 1, wherein the average diameter d of said holes is 0.05 to 2 µm, and coefficients C1 and C2 are 0.2 to 0.9 and 0.02 to 1.0, respectively, said coefficients being defined by the following formulae in relation to said d, the average depth h and the average density ρ of said holes:

C1=h/d; and

C2=ρ×d$^2$.

3. The photovoltaic cell according to claim 2, wherein said holes are conical or pyramidal.

4. The photovoltaic cell according to claim 3, wherein said substrate comprises stainless steel.

5. The photovoltaic cell according to claim 1, wherein said holes are conical or pyramidal.

6. The photovoltaic cell according to claim 1, wherein crystal grains of said transparent conductive layer near the interface with said back reflector are small, and columnar crystal grains are formed thereon so as to form said holes.

7. The photovoltaic cell according to any one of claims 1 to 6, wherein said substrate comprises stainless steel.

8. The photovoltaic cell according to claim 1, wherein said transparent conductive layer contains zinc oxide.

9. The photovoltaic cell according to claim 1, wherein diffuse reflectance of said substrate is 3 to 50%.

10. The photovoltaic cell according to claim 1, wherein said back reflector contains at least one element selected from the group consisting of gold, silver, copper, aluminum, and magnesium.

11. The photovoltaic cell according to claim 10, wherein said back reflector further contains silicon.

12. The photovoltaic cell according to claim 1, wherein said back reflector further has a lamination structure comprising a plurality of layers.

13. The photovoltaic cell according to claim 1, wherein said photoelectric conversion layer has holes on its surface.

14. The photovoltaic cell according to claim 1, wherein said photoelectric conversion layer has a plurality of pin junctions.

15. The photovoltaic cell according to claim 1, wherein said photoelectric conversion layer comprises a non-single crystal semiconductor.

16. A method for manufacturing a photovoltaic cell comprising a substrate, a back reflector, a transparent conductive layer and a photoelectric conversion layer stacked in this order, wherein diffuse reflectance of said back reflector is 3 to 50% and said transparent conductive layer has holes on the surface comprising a step of:

depositing said transparent conductive layer by sputtering at a substrate temperature of 200 to 450° C. under a pressure of 5 to 20 mTorr with an electrical power applied to a target which is a DC power of −350 to −450 V or an RF power of 100 to 400 W.

17. A method for manufacturing a photovoltaic cell comprising a substrate, a back reflector, a transparent conductive layer and a photoelectric conversion layer stacked in this order, wherein diffuse reflectance of said back reflector is 3 to 50% and said transparent conductive layer has holes on the surface comprising the steps of:

forming said transparent conductive layer; and subjecting said transparent conductive layer to an etching treatment to form said holes after said forming step.

18. The method for manufacturing a photovoltaic cell according to claim 17, wherein an annealing treatment is further performed after said etching treatment.

19. The method for manufacturing a photovoltaic cell according to claim 18, wherein said annealing treatment is performed in an atmosphere of air, water vapor, nitrogen, hydrogen, oxygen, or inert gas.

20. A photovoltaic cell comprising a substrate, a back reflector, a photovoltaic conversion layer, and a transparent conductive layer disposed between said back reflector and said photoelectric conversion layer;

wherein diffuse reflectance of said substrate or said back reflector or both of said substrate and said back reflector is 3 to 50%, said photoelectric conversion layer contains at least silicon and germanium, and said transparent conductive layer has holes on the surface.

21. The photovoltaic cell according to claims 20, wherein said transparent conductive layer contains zinc oxide.

22. The photovoltaic cell according to claim 20, wherein said photoelectric conversion layer also has holes on the surface.

23. A photovoltaic cell comprising a substrate, a back reflector, a transparent conductive layer, and a photoelectric conversion layer, wherein diffuse reflectance of said back reflector is 3 to 50%.

24. The photovoltaic cell according to claim 23, wherein diffuse reflectance of said substrate is 3 to 50%.

25. The photovoltaic cell according to claim 23, wherein said substrate comprises stainless steel.

26. The photovoltaic cell according to claim 23, wherein said back reflector contains at least one element selected from the group consisting of gold, silver, copper, aluminum, and magnesium.

27. The photovoltaic cell according to claim 26, wherein said back reflector further contains silicon.

28. The photovoltaic cell according to claim 23, wherein said back reflector further has a lamination structure comprising a plurality of layers.

29. The photovoltaic cell according to claim 23, wherein said photoelectric conversion layer has a plurality of pin junctions.

30. The photovoltaic cell according to claim 23, wherein said photoelectric conversion layer comprises a non-single crystal semiconductor.

31. A photovoltaic cell comprising a substrate, a back reflector, and a photoelectric conversion layer, wherein diffuse reflectance of said substrate and/or said back reflector is 3 to 50%, and said photoelectric conversion layer contains at least silicon germanium.

32. The photovoltaic cell according to claim 31, wherein said substrate comprises stainless steel.

33. The photovoltaic cell according to claim 31, wherein said back reflector contains at least one element selected from the group consisting of gold, silver, copper, aluminum, and magnesium.

34. The photovoltaic cell according to claim 33, wherein said back reflector further contains silicon.

35. The photovoltaic cell according to claim 31, wherein said back reflector further has a lamination structure comprising a plurality of layers.

36. The photovoltaic cell according to claim 31, wherein said photoelectric conversion layer has a plurality of pin junctions.

37. The photovoltaic cell according to claim 36, wherein among said pin junctions, at least the pin junction closest to said substrate contains germanium.

38. The photovoltaic cell according to claim 31, wherein said photoelectric conversion layer comprises a non-single crystal semiconductor.

* * * * *

UNITED STATES PATENT AND TRADEMARK OFFICE
CERTIFICATE OF CORRECTION

PATENT NO. : 6,331,672 B1
DATED : December 18, 2001
INVENTOR(S) : Koichi Matsuda et al.

It is certified that error appears in the above-identified patent and that said Letters Patent is hereby corrected as shown below:

Column 1,
Line 26, "No. 5943101," should read -- No. 59-43101, --;
Line 38, "Deckman" should read -- Deckman, --; and
Line 67, "further" should be deleted.

Column 2,
Line 35, "And" should read -- and --.

Column 3,
Line 34, close up right margin; and
Line 35, close up left margin.

Column 4,
Line 48, "HMRB" should read -- HHRB --; and
Line 65, "a" (second occurrence) should read -- an --.

Column 6,
Line 13, "anri" should read -- and --.

Column 7,
Line 54, "iometallic" should read -- metallic --; and
Line 59, "pin holes" should read -- pinholes --.

Column 8,
Line 23, "be" (first occurrence) should be deleted; and
Line 24, "be" (first occurrence) should be deleted.

Column 11,
Line 7, "GRz," should read -- GHz, --.

Column 12,
Line 40, "iof" should read -- of --.

Column 13,
Line 31, "(SEK)." should read -- (SEM). --; and
Line 63, "REF" should read -- RF --.

UNITED STATES PATENT AND TRADEMARK OFFICE
CERTIFICATE OF CORRECTION

PATENT NO. : 6,331,672 B1
DATED : December 18, 2001
INVENTOR(S) : Koichi Matsuda et al.

It is certified that error appears in the above-identified patent and that said Letters Patent is hereby corrected as shown below:

Column 14,
Line 19, "applied-from" should read -- applied from --;
Line 36, "charter" should read -- chamber --;
Line 40, "and-MW" should read -- and MW --; and
Line 54, "RE" should read -- RF --.

Column 16,
Line 50, "50º C.;" should read -- 50º C., --; and
Line 56, "aging) (Initial" should read -- aging)/(Initial --.

Column 17,
Line 67, "the-conditions" should read -- the conditions --.

Column 18,
Line 2, "was" should read -- were --;
Table 2-1, Line 47, "Si2H6" should read -- $Si_2H_6$ --; and
"110 sccm;" should read -- 90 sccm; -- and
Table 2-1, Line 48, "2.0 W;" should read -- 1.7 W; --.

Column 20,
Line 15, "pm" should read -- μm --; and
Line 28, "to 1.0" should read -- to 1.0, --.

Column 21,
Table 2-4, "$\frac{1.50}{0.83}$" should read -- $\frac{1.50}{0.82}$ --.

Column 22,
Line 6, "sus" should read -- SUS --;
Line 11, "similar" should read -- similarly --;
Line 13, "thick," should read -- thick --; and
Line 50, "power." should read -- power --.

Column 23,
Line 12, "the-rewinding" should read -- the rewinding --.

UNITED STATES PATENT AND TRADEMARK OFFICE
CERTIFICATE OF CORRECTION

PATENT NO. : 6,331,672 B1
DATED : December 18, 2001
INVENTOR(S) : Koichi Matsuda et al.

It is certified that error appears in the above-identified patent and that said Letters Patent is hereby corrected as shown below:

<u>Column 24,</u>
Line 58, "forcelincident" should read -- force/incident --; and
Line 59, "WHRB" should read -- HHRB --.

<u>Column 25,</u>
Line 46, "HfRB" should read -- HHRB --.

<u>Column 27,</u>
Line 24, "claims" should read -- claim --.

Signed and Sealed this

Tenth Day of September, 2002

Attest:

JAMES E. ROGAN
*Attesting Officer*  *Director of the United States Patent and Trademark Office*